(12) United States Patent
Kim et al.

(10) Patent No.: US 11,696,404 B2
(45) Date of Patent: Jul. 4, 2023

(54) ELECTRONIC DEVICE INCLUDING STRUCTURE FOR STACKING SUBSTRATES

(71) Applicant: Samsung Electronics Co., Ltd., Suwon-si (KR)

(72) Inventors: Manho Kim, Suwon-si (KR); Hwajoong Jung, Suwon-si (KR); Kihuk Lee, Suwon-si (KR); Yonghwan Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/139,365

(22) Filed: Dec. 31, 2020

(65) Prior Publication Data

US 2021/0212209 A1  Jul. 8, 2021

(30) Foreign Application Priority Data

Jan. 3, 2020  (KR) .................. 10-2020-0001030

(51) Int. Cl.
| | |
|---|---|
| *H05K 1/14* | (2006.01) |
| *H05K 1/02* | (2006.01) |
| *H05K 1/11* | (2006.01) |

(52) U.S. Cl.
CPC ............. *H05K 1/14* (2013.01); *H05K 1/0215* (2013.01); *H05K 1/0218* (2013.01); *H05K 1/117* (2013.01); *H05K 1/144* (2013.01); *H05K 2201/042* (2013.01); *H05K 2201/10378* (2013.01); *H05K 2201/2018* (2013.01)

(58) Field of Classification Search
CPC . H05K 1/11; H05K 1/14; H05K 1/141; H05K 1/144; H05K 1/145; H05K 2201/10371; H05K 2201/10387; H01R 12/52; H01R 12/714; H01R 13/2414
See application file for complete search history.

(56) References Cited

U.S. PATENT DOCUMENTS

| | | | | |
|---|---|---|---|---|
| 3,951,493 | A | * | 4/1976 | Kozel ................. G04G 17/06 968/881 |
| 5,540,594 | A | * | 7/1996 | Collins .............. H01R 13/2414 439/91 |
| 5,967,799 | A | * | 10/1999 | Arai ..................... H01R 12/775 439/108 |

(Continued)

FOREIGN PATENT DOCUMENTS

| | | | |
|---|---|---|---|
| CN | 209710612 U | * 11/2019 | ............... H05K 1/14 |
| JP | 2010-080691 A | 4/2010 | |
| KR | 10-2014-0103110 A | 8/2014 | |

OTHER PUBLICATIONS

International Search Report dated Apr. 22, 2021, issued in International Patent Application No. PCT/KR2020/019498.

*Primary Examiner* — Paresh Paghadal
(74) *Attorney, Agent, or Firm* — Jefferson IP Law, LLP

(57) ABSTRACT

An electronic device is provided. The electronic device includes a first substrate on which a first electrical element and a first conductive structure, which is configured to surround the first electrical element, are disposed, a second substrate on which a second electrical element and a second conductive structure, which is separably connected to the first conductive structure, are disposed, and a connector which is disposed between the first substrate and the second substrate and electrically connects the first electrical element to the second electrical element.

16 Claims, 12 Drawing Sheets

(56) References Cited

U.S. PATENT DOCUMENTS

| | | | | |
|---|---|---|---|---|
| 5,984,692 A | * | 11/1999 | Kumagai | H01L 23/49811 257/E23.068 |
| 6,224,394 B1 | * | 5/2001 | Matsumoto | H01R 13/2414 439/66 |
| 7,808,072 B2 | | 10/2010 | Choi et al. | |
| 8,084,839 B2 | | 12/2011 | Choi et al. | |
| 8,672,688 B2 | | 3/2014 | Florence, Jr. et al. | |
| 8,976,540 B2 | | 3/2015 | Too | |
| 11,032,953 B2 | * | 6/2021 | Harrigan | H05K 1/181 |
| 11,069,623 B2 | * | 7/2021 | Kwon | H01L 24/16 |
| 2002/0016096 A1 | * | 2/2002 | Custer | H01R 12/7082 439/83 |
| 2005/0184381 A1 | * | 8/2005 | Asahi | H05K 3/361 257/693 |
| 2008/0102701 A1 | | 5/2008 | Suzuki et al. | |
| 2008/0165517 A1 | * | 7/2008 | Wang | H05K 7/1417 361/800 |
| 2008/0184381 A1 | * | 7/2008 | Cohen | A61P 25/18 435/7.1 |
| 2009/0224376 A1 | | 9/2009 | Choi et al. | |
| 2010/0321900 A1 | | 12/2010 | Choi et al. | |
| 2013/0016484 A1 | | 1/2013 | Yoo | |
| 2013/0048369 A1 | * | 2/2013 | Malek | H05K 9/0032 174/377 |
| 2014/0168908 A1 | * | 6/2014 | Chuang | H05K 1/0218 361/735 |
| 2015/0264842 A1 | * | 9/2015 | Song | H01L 23/42 29/840 |
| 2016/0066482 A1 | * | 3/2016 | Chi | H05K 9/0032 174/378 |
| 2017/0142823 A1 | * | 5/2017 | Shim | G06F 1/1656 |
| 2017/0181336 A1 | * | 6/2017 | Robinson | H05K 9/0032 |
| 2018/0084323 A1 | * | 3/2018 | Luce | H04R 1/028 |

* cited by examiner

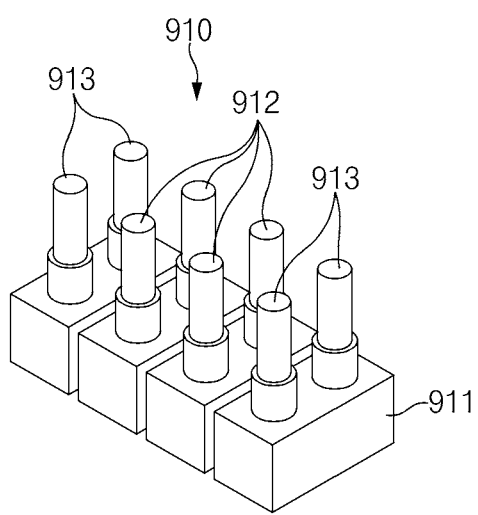
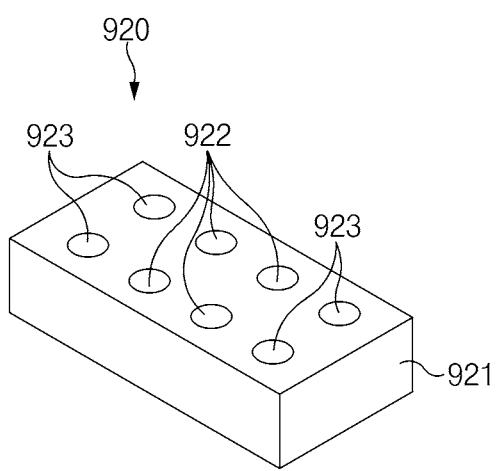
FIG.9A
FIG.9B

ELECTRONIC DEVICE INCLUDING STRUCTURE FOR STACKING SUBSTRATES

CROSS-REFERENCE TO RELATED APPLICATION(S)

This application is based on and claims priority under 35 U.S.C. § 119(a) of a Korean patent application number 10-2020-0001030, filed on Jan. 3, 2020, in the Korean Intellectual Property Office, the disclosure of which is incorporated by reference herein in its entirety.

BACKGROUND

1. Field

The disclosure relates to an electronic device including a structure for stacking substrates.

2. Description of Related Art

Electronic devices may include a substrate on which one or more electrical elements are mounted. Two or more substrates may be stacked in order to efficiently utilize an inner space of an electronic device and mount more electrical elements thereon. The electronic device may further include an interposer for electrically connecting the two or more stacked substrates.

Recently, as functions of the electronic device has been diversified, an operation clock of the electrical element is increasing, and a data transfer speed is also increasing. Due to an electrical component operated at a high frequency, electromagnetic interference (EMI) may occur. The EMI may cause the occurrence of an operation failure of the electronic device. A shield can for performing a shielding operation may be disposed in a portion of a substrate in order to prevent the EMI. The shield can may include a metal material and cover the electrical elements.

The above information is presented as background information only to assist with an understanding of the disclosure. No determination has been made, and no assertion is made, as to whether any of the above might be applicable as prior art with regard to the disclosure.

SUMMARY

An electronic device may include a first substrate and a second substrate and include an interposer which is disposed between the first substrate and the second substrate and electrically connects the first substrate to the second substrate. The interposer is mounted on each of the first substrate and the second substrate (through a surface mount technology (SMT)) and thus may be coupled to the first substrate and the second substrate. In a coupling structure of the substrate and the interposer, it may be difficult to perform an operation of applying the surface mount technology to each of the substrates facing each other. Also, since it is difficult to separate the interposer from the substrate, it may be difficult to debug or analyze defects of a product. In addition, because the substrate has a thin and wide shape, deflection may occur at an edge portion thereof, and because the interposer includes a hard material, there may be an error exceeding a tolerance when the substrate and the interposer are assembled.

Aspects of the disclosure are to address at least the above-mentioned problems and/or disadvantages and to provide at least the advantages described below. Accordingly, an aspect of the disclosure is to provide a structure for stacking substrates, in which positions of the first substrate and the second substrate are determined in order for the first substrate and the second substrate to be separably connected to each other and for the first substrate and the second substrate to be electrically connected to each other, and an electronic device including the same. Various embodiments may provide, for example, an electronic device that includes the structure for stacking the substrates in the electronic device.

Additional aspects will be set forth in part in the description which follows and, in part, will be apparent from the description, or may be learned by practice of the presented embodiments.

In accordance with an aspect of the disclosure, an electronic device is provided. The electronic device includes a first substrate on which a first electrical element and a first conductive structure, which is configured to surround the first electrical element, are disposed, a second substrate on which a second electrical element and a second conductive structure, which is separably connected to the first conductive structure, are disposed, and a connector which is disposed between the first substrate and the second substrate and electrically connects the first electrical element to the second electrical element.

In accordance with another aspect of the disclosure, an electronic device is provided. The electronic device includes a first substrate including a first mounting area on which a first electrical element is disposed, a first signal line electrically connected to the first electrical element, and a first ground area, a first conductive structure provided on the first substrate in order to surround at least a portion of the first mounting area and electrically connected to the first ground area, a second substrate including a second signal line and a second ground area and stacked above the first substrate in order to face the first mounting area, a second conductive structure coupled to at least a portion of a peripheral portion of the second substrate, electrically connected to the second ground area, and separably coupled to the first conductive structure, and a connector provided on at least one of the first mounting area or the second substrate and configured to electrically connect the first signal line of the first substrate to the second signal line of the second substrate.

In accordance with another aspect of the disclosure, an electronic device is provided. The electronic device includes a first substrate including a first surface and a second surface opposite to the first surface, a second substrate including a third surface and a fourth surface opposite to the third surface, the second substrate being disposed so that the third surface faces the first surface, a first conductive structure provided on the first surface, extending from the first surface to the third surface, and configured to surround at least a partial area of the first surface, and a second conductive structure including a first portion disposed on at least a portion of the fourth surface and a second portion extending from the first portion toward the first surface, wherein the second portion is coupled to the first conductive structure, wherein the second portion has a coupling protrusion that protrudes toward the first conductive structure, and wherein the first conductive structure has a coupling groove into which the coupling protrusion is accommodated.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 9A and 9B are views illustrating a connector of an electronic device according to various embodiments of the disclosure.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
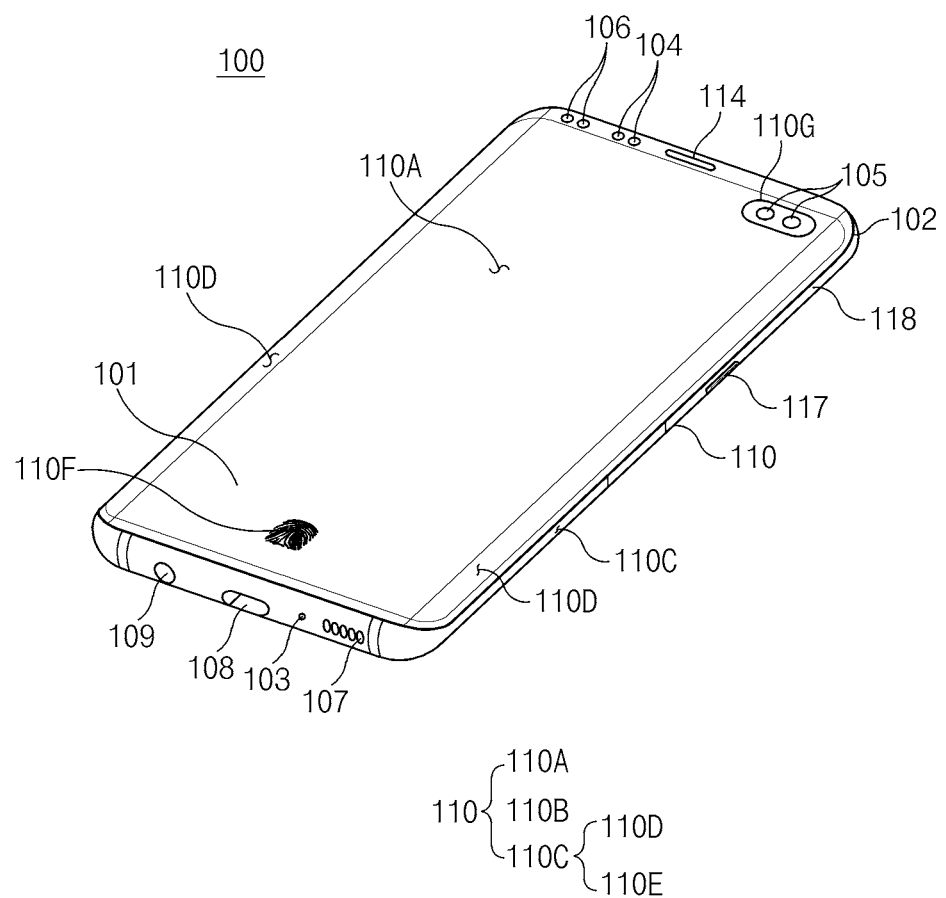
FIG. 1 is a front perspective view of an electronic device according to an embodiment of the disclosure.

FIG. 1 is a front perspective view of an electronic device according to an embodiment of the disclosure.

Figure 2:
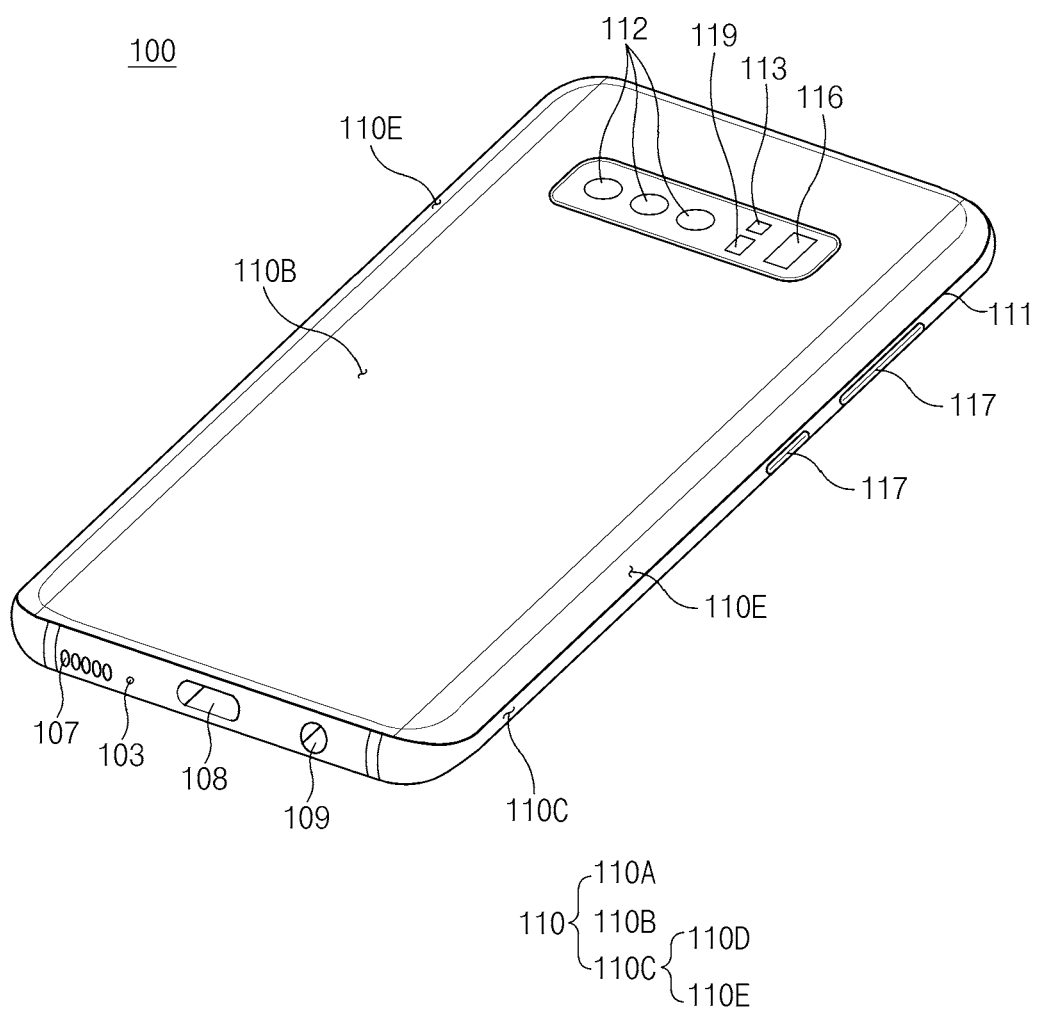
FIG. 2 is a rear perspective view of an electronic device according to an embodiment of the disclosure.

FIG. 2 is a rear perspective view of an electronic device according to an embodiment of the disclosure.

Referring to FIGS. 1 and 2, an electronic device 100 according to an embodiment may include a housing 110 that has a first surface 110A (or a front surface), a second surface 110B (or a rear surface), and a side surface 110C surrounding a space between the first surface 110A and the second surface 110B.

In another embodiment (not illustrated), the housing 110 may be referred to as a structure of providing portions of the first surface 110A, the second surface 110B, and the side surface 110C of FIG. 1.

According to an embodiment, the first surface 110A may be constituted by a front plate 102 (for example, a glass plate or polymer plate including various coating layers) at least of which is substantially transparent. The second surface 110B may be constituted by a rear plate 111 which is substantially opaque. The rear plate 111 may be made of, for example, coated or colored glass, ceramic, fiber, metal (for example, aluminum, stainless steel (STS), or magnesium), or a combination of at least two of the materials described above. The side surface 110C may be coupled to the front plate 102 and the rear plate 111, and may be constituted by a side bezel structure 118 (or a "frame structure") including metal and/or polymer.

In an embodiment, the rear plate 111 and the side bezel structure 118 may be integrated with each other and include the same material (for example, a metal material such as aluminum).

In the front plate 102 of the illustrated embodiment, two first areas 100D bent and seamlessly extending from the first surface 110A toward the rear plate 111 may be provided at long edges on both ends of the front plate 102.

In the rear plate 111 of the illustrated embodiment (see FIG. 2), two second areas 100E bent and seamlessly extending from the second surface 110B toward the front plate 102 may be provided at long edges on both ends of the rear plate 111.

In an embodiment, the front plate 102 (or the rear plate 111) may include only one of the first areas 110D (or the second areas 110E). In another embodiment, the front plate 102 (or the rear plate 111) may not include a portion of the first areas 110D (or the second areas 110E).

In the embodiments, when the electronic device 100 is viewed from the side, the side bezel structure 118 may have a first thickness (or width) which is defined on a side surface (for example, a short side) not including the first areas 110D or the second areas 110E, and a second thickness (or width) which is defined on a side surface (for example, a long side) including the first areas 110D or the second areas 110E and is less than the first thickness.

According to an embodiment, the electronic device 100 may include at least one among a display 101, audio modules 103, 107, and 114, sensor modules 104, 116, and 119, camera modules 105, 112, and 113, key input device 117, a light emitting element 106, and connector holes 108 and 109. In an embodiment, the electronic device 100 may not include at least one of the components described above (for example, the key input device 117 or the light emitting element 106) or additionally include other components.

The display 101 may be exposed, for example, through a substantial portion of the front plate 102. In an embodiment, at least a portion of the display 101 may be exposed through the front plate 102 that includes the first surface 110A and the first areas 110D of the side surface 110C.

In an embodiment, a corner of the display 101 may have substantially the same shape as the outline adjacent to the front plate 102. In another embodiment (not illustrated), in order to increase the area of the display 101 to be exposed, a gap between the outline of the display 101 and the outline of the front plate 102 may be substantially constant.

In an embodiment, the surface (or the front plate 102) of the housing 110 may include a screen display area, which is formed as the display 101 is visually exposed. For example, the screen display area may include the first surface 110A and the first areas 110D of the side surface.

In an embodiment, the screen display areas 110A and 110D may include a sensing area 110F configured to acquire biological information about a user. Here, a feature in which "the screen display areas 110A and 110D include the sensing area 110F" may be understood as that at least a portion of the sensing area 110F may overlap the screen display areas 110A and 110D. For example, the sensing area 110F may represent an area which may display visual information through the display 101 as in other areas of the screen display areas 110A and 110D, and may additionally acquire the biological information (for example, fingerprints) of the user.

In an embodiment, the screen display areas 110A and 110D of the display 101 may include an area 110G through which a first camera device 105 (for example, a punch hole camera) may be visually exposed. For example, at least a portion of an edge of the area 110G, through which the first camera device 105 is exposed, may be surrounded by the screen display areas 110A and 110D. In various embodiments, the first camera device 105 may include a plurality of camera devices.

In another embodiment (not illustrated), a recess or an opening may be provided in a portion of the screen display areas 110A and 110D of the display 101, and at least one of an audio module 114, a first sensor module 104, or the light emitting element 106 may be provided, which is aligned with the recess or the opening.

In another embodiment (not illustrated), the display 101 may include, on the rear surfaces of the screen display areas 110A and 110D, at least one of the audio module 114, the sensor modules 104, 116, and 119, and the light emitting element 106.

In another embodiment (not illustrated), the display 101 may be coupled to or disposed adjacent to a touch sensing circuit, a pressure sensor capable of measuring the intensity (pressure) of touch, and/or a digitizer for detecting a magnetic field-type stylus pen.

In an embodiment, at least a portion of the sensor modules 104, 116, and 119 and/or at least a portion of the key input device 117 may be disposed on the side surface 110C (for example, the first areas 110D and/or the second areas 110E).

The audio modules 103, 107, and 114 may include a microphone hole 103 and speaker holes 107 and 114. In the microphone hole 103, a microphone for acquiring external sound may be disposed therein, and in an embodiment, a plurality of microphones may be disposed in order to detect the direction of sound. The speaker holes 107 and 114 may include a speaker hole 107 and a communication receiver hole 114. In an embodiment, the speaker holes 107 and 114 and the microphone hole 103 are embodied as a single hole, or a speaker (for example, a piezo speaker) without the speaker holes 107 and 114 may be provided.

The sensor modules 104, 116, and 119 may generate electrical signal or data values corresponding to an internal operation state or an external environment state of the electronic device 100. For example, the sensor modules 104, 116, and 119 may include a first sensor module 104 (for example, a proximity sensor) disposed on the first surface 110A of the housing 110, a second sensor module 116 (for example, a TOF camera device) disposed on the second surface 110B of the housing 110, a third sensor module 119 (for example, an HRM sensor) disposed on the rear surface 110B of the housing 110, and/or a fourth sensor module (for example, a sensor 190 of FIG. 3) (for example, a fingerprint sensor) coupled to the display 101.

In various embodiments, the sensor module 116 may include a TOF camera device for measuring a distance.

In various embodiment, at least a portion of the fourth sensor module (for example, the sensor 190 of the FIG. 3) may be disposed below the screen display areas 110A and 110D. For example, the fourth sensor module may be disposed in a recess (for example, a recess 139 of FIG. 3) formed in the rear surface of the display 101. That is, the fourth sensor module (for example, the sensor 190 of the FIG. 3) is not exposed through the screen display areas 110A and 110D, and the sensing area 110F may be provided in at least a portion of the screen display areas 110A and 110D.

In an embodiment (not illustrated), the fingerprint sensor may be disposed not only on the first surface 110A of the housing 110 (for example, the screen display areas 110A and 110D) but also on the second surface 110B.

In various embodiments, the electronic device 100 may include at least one of sensor modules not illustrated but including, for example, a gesture sensor, a gyro sensor, an atmospheric pressure sensor, a magnetic sensor, an acceleration sensor, a grip sensor, a color sensor, an infrared (IR) sensor, a bio-sensor, a temperature sensor, a humidity sensor, or an illuminance sensor.

The camera modules 105, 112, and 113 may include a first camera device 105 (for example, a punch hole camera) exposed through the first surface 110A of the electronic device 100, and a second camera device 112 and/or a flash 113 exposed through the second surface 110B.

In the illustrated embodiment, the first camera device 105 may be exposed through a portion of the screen display area 110D in the first surface 110A. For example, the first camera device 105 may be exposed to a portion of the screen display area 110D through an opening (not illustrated) provided in a partial area of the display 101.

In the illustrated embodiment, the second camera device 112 may include a plurality of camera devices (for example, dual cameras or triple cameras). However, the second camera device 112 is not necessarily limited to including the plurality of camera devices but may include a single camera device.

The camera devices 105 and 112 may include one or a plurality of lenses, an image sensor, and/or an image signal processor. The flash 113 may include, for example, a light emitting diode or a xenon lamp. In an embodiment, two or more lenses (an infrared camera and wide-angle and telephoto lenses) and image sensors may be disposed on one surface of the electronic device 100.

The key input device 117 may be disposed on the side surface 110C of the housing 110. In another embodiment, the electronic device 100 may not include a portion or the whole of the key input device 117 mentioned above, but another form such as a soft key may be embodied on the display 101 instead of including the key input device 117. In an embodiment, the key input device may include a sensor module (for example, a sensor 190 of FIG. 3) that provides the sensing area 110F included in the screen display areas 110A and 110D.

The light emitting element 106 may be disposed on, for example, the first surface 110A of the housing 110. The light emitting element 106 may provide, for example, state information about the electronic device 100 in the form of light. In another embodiment, the light emitting element 106 may provide, for example, a light source in association with the operation of the first camera device 105. The light emitting element 106 may include, for example, an LED, an IR LED, and a xenon lamp.

The connector holes 108 and 109 may include a first connector hole 108 capable of accommodating a connector (for example, an USB connector) for transmitting and receiving electric power and/or data to and from an external electronic device, and/or a second connector hole 109 capable of accommodating a connector (for example, an earphone jack) for transmitting and receiving an audio signal to and from an external electronic device.

Figure 3:
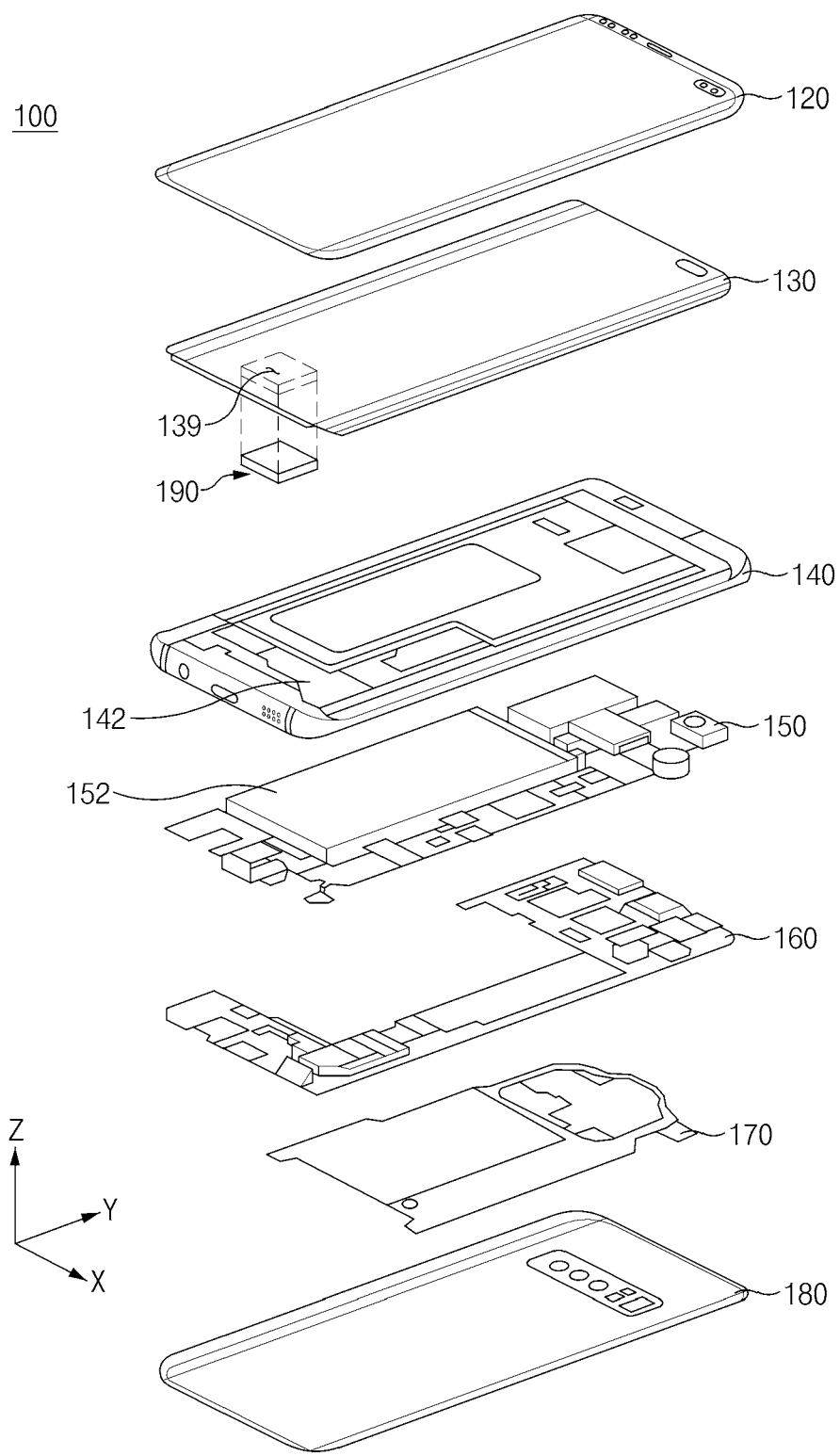
FIG. 3 is an exploded perspective view of an electronic device according to an embodiment of the disclosure.

FIG. 3 is an exploded perspective view of an electronic device according to an embodiment of the disclosure.

Referring to FIG. 3, an electronic device 100 may include a first cover 120 (for example, the front surface 110A of FIG. 1 and the first areas 110D), a display 130 (for example, the display 101 of FIG. 1), a bracket 140 (for example, a portion of the side surface 110C of FIG. 1), a first support member 142 (for example, a plate structure), a printed circuit board 150, a battery 152, a rear case 160, an antenna 170, and a second cover 180 (for example, the rear surface 110B of FIG. 1 and the second areas 110E). In an embodiment, the electronic device 100 may not include at least one of the components described above (for example, the first support member 142 or the rear case 160) or additionally include other components. At least one of the components of the electronic device 100 may be identical or similar to at least one of the components of the electronic device 100 of FIG. 1 or 2, and hereinafter, the duplicated description thereof will be omitted.

The first support member 142 may be disposed inside the electronic device 100, and may be connected to the bracket 140 or integrated with the bracket 140. The first support member 142 may be made of, for example, a metal material and/or a non-metal material (for example, polymer). The display 130 may be coupled to one surface of the first support member 142, and the printed circuit board 150 may be coupled to the other surface thereof. A processor, a memory, and/or an interface may be mounted on the printed circuit board 150. The processor may include, for example, one or more of a central processing unit, an application processor, a graphics processing unit, an image signal processor, a sensor hub processor, or a communication processor.

The memory may include, for example, a volatile memory or a non-volatile memory.

The interface may include, for example, a high definition multimedia interface (HDMI), a universal serial bus (USB) interface, an SD card interface, and/or an audio interface. The interface may include, for example, electrically or physically connect the electronic device 100 to an external electronic device, and may include a USB connector, an SD card/MMC connector, or an audio connector.

The battery 152 may be a device for supplying electric power to at least one component of the electronic device 100, and may include, for example, a non-rechargeable primary battery, a rechargeable secondary battery, or a fuel cell. For example, at least a portion of the battery 152 may be disposed on substantially the same plane as the printed circuit board 150. The battery 152 may be disposed integrally inside the electronic device 100 or disposed to be attachable to and detachable from the electronic device 100.

The antenna 170 may be disposed between the second cover 180 and the battery 152. The antenna 170 may include, for example, a near field communication (NFC) antenna, a wireless charging antenna, and/or a magnetic secure transmission (MST) antenna. The antenna 170 may perform, for example, near field communication with an external device, and may wirelessly transmit and receive electric power required for charging. In another embodiment, the antenna structure may be constituted by a portion or combination of the bracket 140 and/or the first support member 142.

Figure 4:
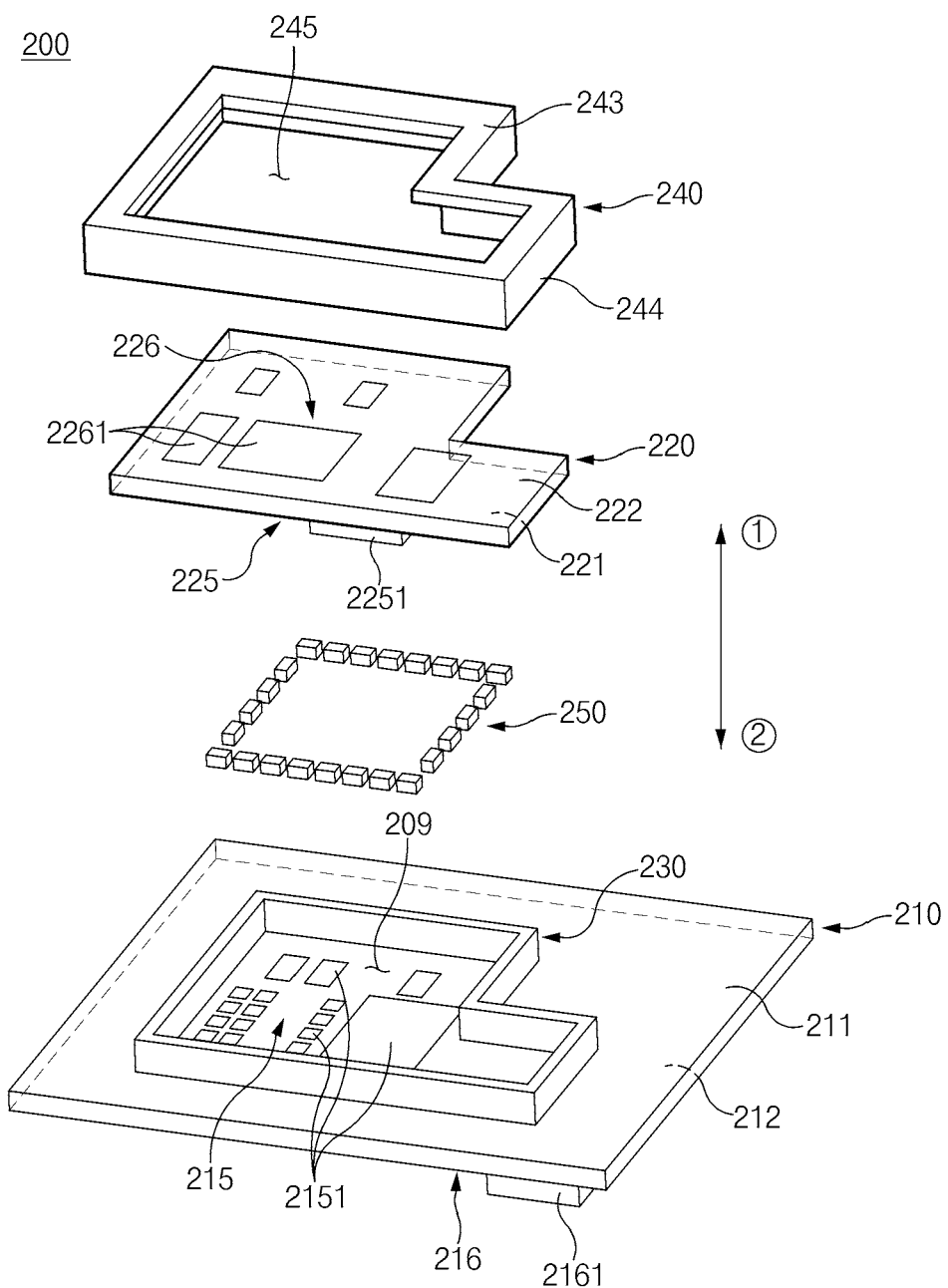
FIG. 4 is a view illustrating a structure for stacking substrates of an electronic device according to an embodiment of the disclosure.

FIG. 4 is a view illustrating a structure for stacking substrates of an electronic device according to an embodiment.

Hereinafter, referring to FIG. 4, an upward direction is referred to as a first direction (for example, a direction ① of FIG. 4), and a downward direction is referred to as a second direction (for example, a direction ② of FIG. 4).

In an embodiment, a structure 200 for stacking substrates (hereinafter, referred to as a substrate stacking structure 200) may include a first substrate 210, a second substrate 220, a first conductive structure 230, a second conductive structure 240, and a connector 250.

In an embodiment, the first substrate 210 may include a first surface 211 oriented in the first direction and a second surface 212 opposite to the first surface 211. The first surface 211 may face a third surface 221 of the second substrate 220. On the first surface 211, there may be provided a first mounting area 215 on which one or more first electrical elements 2151 and/or the connector 250 are disposed. On the first surface 211, there may be provided the first conductive structure 230 that surrounds at least a portion of the first mounting area 215.

In an embodiment, the first substrate 210 may be electrically connected to the second substrate 220 through the connector 250. For example, an operation of electrically connecting the first substrate 210 to the second substrate 220 may involve that at least one first electrical element 2151 and/or third electrical element 2161 disposed on the first substrate 210 are connected to at least one second electrical element 2251 and/or fourth electrical element 2261 disposed on the second substrate 220 so that an electrical signal is exchanged therebetween.

In various embodiments, the second surface 212 of the first substrate 210 may include a third mounting area 216 on which one or more third electrical elements 2161 are disposed. In various embodiments, the first substrate 210 may have a larger area than the second substrate 220. For example, at least one of a horizontal length or a vertical length of the first substrate 210 may be greater than that of the second substrate 220. The horizontal direction and the vertical direction may represent a direction perpendicular to the thickness direction (for example, the first direction and the second direction). The first substrate 210 may be referred to as a main substrate, and the second substrate 220 may be referred to as a sub-substrate.

In an embodiment, the second substrate 220 may include the third surface 221 facing the first surface 211 of the first substrate 210 and a fourth surface 222 opposite to the third surface 221. On the third surface 221, there may be provided a second mounting area 225 on which one or more second electrical elements 2251 and/or the connector 250 are disposed. The second substrate 220 may be placed above the first substrate with the first conductive structure 230 therebetween. The second substrate 220 may be placed on the first conductive structure 230.

In various embodiments, on the fourth surface 222 of the second substrate 220, there may be provided a fourth mounting area 226 on which one or more fourth electrical elements 2261 are disposed. In an embodiment, at least one connector 250 may be disposed on the third surface 221 of the second substrate 220. In various embodiments, at least one connector 250 may be disposed on the second mounting area 225. In an embodiment, the second substrate 220 may be electrically connected to the first substrate 210 through the connector 250.

In an embodiment, the second substrate 220 may include the second mounting area 225 on which the one or more second electrical elements 2251 are disposed. According to an embodiment, when the second substrate is viewed from above (for example, in the first direction), at least a portion of the second mounting area 225 may overlap the first mounting area 215. According to an embodiment, at least a portion of the second mounting area 225 may be surrounded by the first conductive structure 230.

According to an embodiment, at least a portion of the second substrate 220 may be surrounded by the second conductive structure 240. The second substrate 220 may be coupled to the second conductive structure 240 such that an edge thereof is surrounded by the second conductive structure 240. According to an embodiment, the second conductive structure 240 may be disposed on at least a portion of the second substrate 220 such that the second conductive structure 240 is fastened to the first conductive structure 230.

In an embodiment, the first conductive structure 230 may be disposed on the first substrate 210 in order to surround at least a portion of the first mounting area 215. The first conductive structure 230 may surround at least a portion of the second mounting area 225 when the first substrate 210 and the second substrate 220 are stacked. The first conductive structure 230 may be surface-mounted on the first surface 211 of the first substrate 210 and fixed thereto. According to an embodiment, the first conductive structure 230 may have a wall shape. According to an embodiment, the first conductive structure 230 may extend from the first surface 211 of the first substrate 210 to the third surface 221 of the second substrate 220.

In an embodiment, the first conductive structure 230 may be coupled to the second conductive structure 240 such that at least a portion thereof is surrounded by the second conductive structure 240. The first conductive structure 230 may be disposed closer to the first mounting area 215 than the second conductive structure 240. That is, the first conductive structure 230 may be disposed inside the second conductive structure 240.

In various embodiments, the coupling state between the first conductive structure 230 and the second conductive structure 240 is not limited to that illustrated in the drawing. In an embodiment, the second conductive structure 240 may be disposed inside the first conductive structure 230. For example, the first conductive structure 230 and the second conductive structure 240 may be fastened to each other such that at least a portion of the second conductive structure 240 is disposed inside the first conductive structure 230.

According to an embodiment, at least one of the first conductive structure 230 or the second conductive structure 240 may be omitted. For example, the first conductive structure 230 and the second conductive structure 240 may be provided as a single conductive structure. Here, the single conductive structure may be referred to as a shielding layer or a shielding wall that shields the first mounting area 215 and the second mounting area 225.

In an embodiment, the second conductive structure 240 may include a first portion 243 disposed on the fourth surface 222 of the second substrate 220 and a second portion 244 extending from the first portion 243 toward the first substrate 210. In an embodiment, the second conductive structure 240 may be disposed to surround an edge of the second substrate 220.

In an embodiment, the first portion 243 may cover a partial area (for example, an edge portion) of the fourth surface 222. However, the shape of the second conductive structure 240 is not limited to that illustrated in the drawing. For example, the second conductive structure 240 is formed such that the first portion 243 covers the fourth surface 222 of the second substrate 220.

According to an embodiment, the second conductive structure 240 may include an opening area 245. The fourth electrical element 2261 may be disposed on one area of the second substrate 220 that corresponds to the opening area 245. The second conductive structure 240 may be electrically connected to a ground area included in the second substrate 220.

In an embodiment, the second conductive structure 240 may be disposed outside the first conductive structure 230. Here, a direction toward a shielding space 209 may be referred to as the inside, and a direction opposite thereto may be referred to as the outside. That is, the first conductive structure 230 may be disposed inside the second conductive structure 240. In an embodiment, the second conductive structure 240 may be separably coupled to the first conductive structure 230. In the separably coupled structure according to an embodiment, a coupling protrusion (for example, a coupling protrusion 249 of FIG. 6) facing the first conductive structure 230 may be provided in the second conductive structure 240, and a coupling groove (for example, a coupling groove 239 of FIG. 6) into which the coupling protrusion is accommodated may be provided in the first conductive structure 230. Accordingly, the first conductive structure 230 and the second conductive structure 240 may be electrically connected to each other and structurally separably coupled.

In an embodiment, the connector 250 may be disposed on the first substrate 210 and/or the second substrate 220. In an embodiment, the connector 250 may be disposed on the first mounting area 215 or the second mounting area 225. In an embodiment, the connector 250 may electrically connect the electrical elements (for example, the first electrical element 2151 and the third electrical element 2161) included in the first substrate 210 to the electrical elements (for example, the second electrical element 2251 and the fourth electrical element 2261) included in the second substrate 220.

In an embodiment, the shielding space 209 may be provided by a first ground area (for example, a first ground area 218 of FIG. 6) included in the first substrate 210, the first conductive structure 230, the second conductive structure 240, and a second ground area (for example, a second ground area 228 of FIG. 6) included in the second substrate 220. Here, the shielding space 209 may include the first mounting area 215 and the second mounting area 225 facing each other.

In an embodiment, the connector 250 may have various shapes. For example, the connector 250 may have various shapes such as a contact-type connector, a coupling-type connector, a pin connector, or a spring clip.

Figure 5:
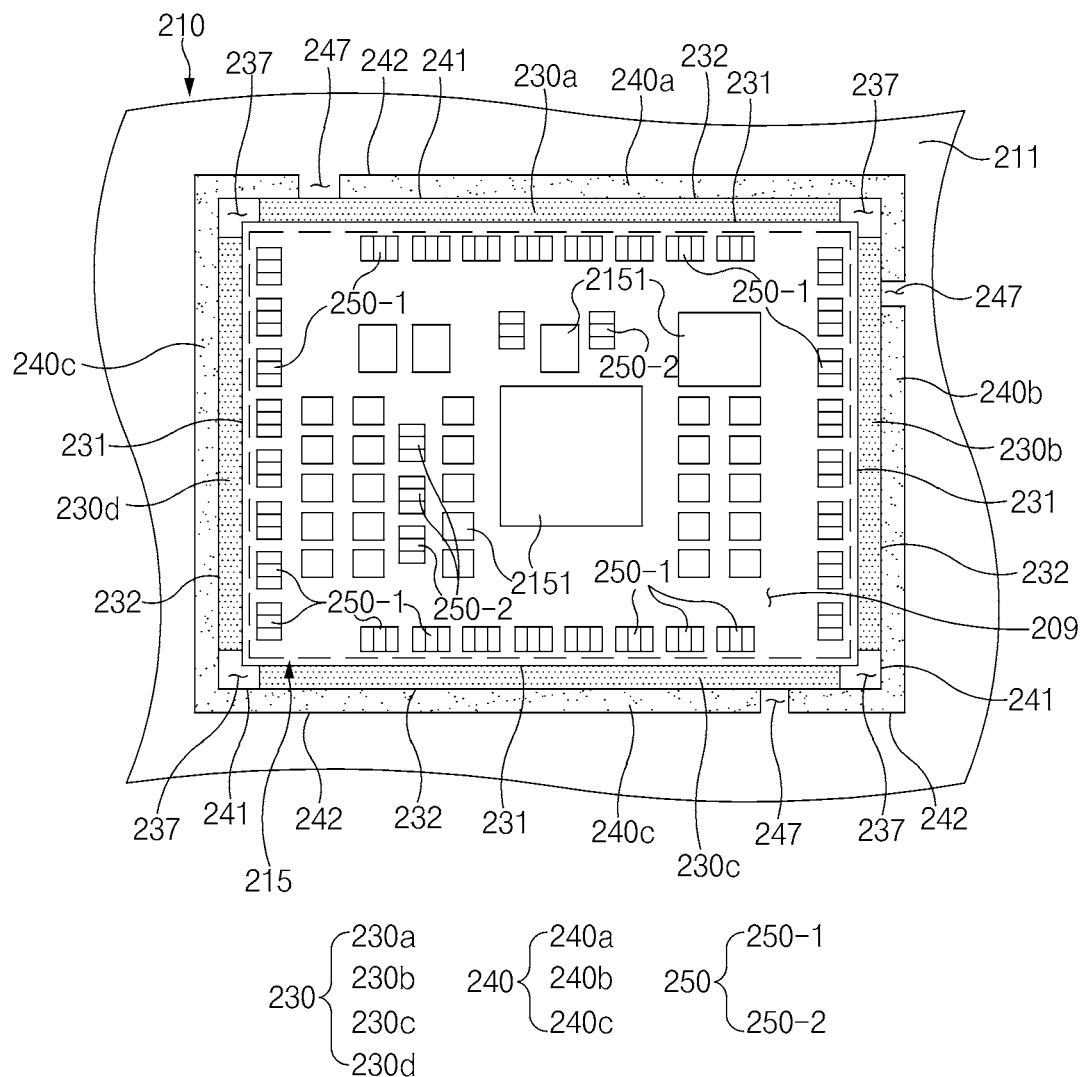
FIG. 5 is a plan view illustrating arrangement of a substrate and a second conductive structure of an electronic device according to an embodiment of the disclosure.

FIG. 5 is a plan view illustrating the arrangement of the first substrate (for example, the first substrate 210 of FIG. 4), the first conductive structure 230, and the second conductive structure 240 in the electronic device according to an embodiment of the disclosure.

Referring to FIG. 5, in an embodiments, the first surface 211 of the first substrate 210 may include a first mounting area 215 having one or more first electrical elements 2151 and the connector 250. Here, the first mounting area 215 may be surrounded by the first conductive structure 230.

In an embodiment, the connector 250 may include a plurality of first connectors 250-1 disposed at a certain distance along the first conductive structure 230 and a plurality of second connectors 250-2 disposed between the first electrical elements 2151. In various embodiments, the first mounting area 215 may be defined by a virtual line that connects the plurality of first connectors 250-1 to each other.

In various embodiments, the plurality of first connectors 250-1 may be disposed to surround the first electrical elements 2151 and the plurality of second connectors 250-2. In various embodiments, one of the plurality of first connectors 250-1 may be spaced a certain distance from neighboring first connectors. In various embodiments, the plurality of first connectors 250-1 may be spaced a certain distance from an inner surface 231 of the first conductive structure 230.

In an embodiment, the first conductive structure 230 may include a first inner surface 231 facing a shielding space (for example, the shielding space 209 of FIG. 4) and a first outer surface 232 opposite to the first inner surface 231. In an embodiment, the second conductive structure 240 may include a second inner surface 241 facing the first conductive structure 230 and a second outer surface 242 opposite to the second inner surface 241. According to an embodiment, at least a portion of the first outer surface 232 of the first conductive structure 230 may face the second inner surface 241 of the second conductive structure 240.

In various embodiment, in order to be mechanically coupled to the second conductive structure 240, a portion of the first outer surface 232 of the first conductive structure 230 may have a coupling groove. At least a portion of the second inner surface 241 of the second conductive structure 240 may have a coupling protrusion that is accommodated into the coupling groove provided in at least the portion of the first outer surface 232 of the first conductive structure 230. According to an embodiment, at least the portion of the first outer surface 232 of the first conductive structure 230 may have the coupling groove, and at least the portion of the second inner surface 241 of the second conductive structure 240 may have the coupling protrusion that is accommodated into the coupling groove provided in at least the portion of the first outer surface 232. According to an embodiment, positions of the coupling groove and the coupling protrusion are not limited to those illustrated embodiment (for example, the coupling groove 239 and the coupling protrusion 249 of FIG. 6), but the positions of the coupling groove and the coupling protrusion may be changed according to various embodiments. For example, at least a portion of the first outer surface 232 of the first conductive structure 230 may have a coupling protrusion, and at least a portion of the second inner surface 241 of the second conductive structure 240 may have a coupling groove.

In various embodiments, the first conductive structure 230 may include a plurality of conductive structures 230a, 230b, 230c, and 230d. In various embodiments, the plurality of conductive structures 230a, 230b, 230c, 230d may be spaced certain distances (for example, first spaces 237) from each other. According to an embodiment, the certain distances may have distances different from each other. Here, the first spaces 237 provided between the plurality of conductive structures 230a, 230b, 230c, and 230d may be covered by the second conductive structure 240. According to an embodiment, the plurality of conductive structures 230a, 230b, 230c, and 230d may be provided as a single conductive structure (not illustrated) without a separate distance (for example, the first spaces 237).

In various embodiments, the second conductive structure 240 may include a plurality of conductive structures 240a, 240b, and 240c. In various embodiments, the plurality of conductive structures 240a, 240b, and 240c may be spaced predetermined distances from each other. Here, second spaces 247 provided between the plurality of conductive structures 240a, 240b, and 240c may be covered by the first conductive structure 230. In another embodiment, the plurality of conductive structures 240a, 240b, and 240c may be provided as a single conductive structure (not illustrated) without a separate distance (for example, the second spaces 247).

In various embodiments, the second conductive structure 240 may provide a shielding space (for example, the shielding space 209 of FIG. 4) in conjunction with the first conductive structure 230. The first conductive structure 230 and the second conductive structure 240 may prevent a noise generated in the electrical element (for example, the first electrical element 2151) disposed inside from being discharged to the outside of a shielding space (for example, the shielding space 209 of FIG. 4), or prevent a noise outside a shielding space (for example, the shielding space 209 of FIG. 4) from being introduced to the inside of the shielding space (for example, the shielding space 209 of FIG. 4).

Figure 6:
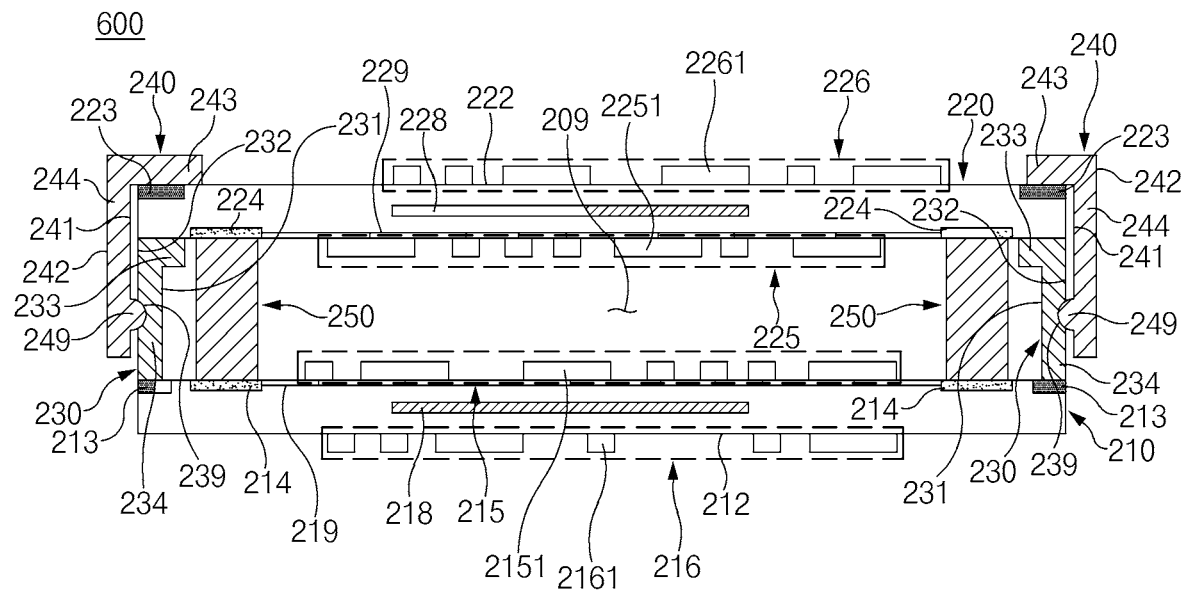
FIG. 6 is a cross-sectional view of a structure for stacking substrates of an electronic device according to an embodiment of the disclosure.

FIG. 6 is a cross-sectional view of a substrate stacking structure 600 of an electronic device according to an embodiment of the disclosure.

Referring to FIG. 6, in an embodiment, the first substrate 210 may include a first signal line 219 and a first ground area 218. For example, the first signal line 219 may be electrically connected to the first electrical element 2151 included on the first mounting area 215 of the first substrate 210. The first signal line 219 may transmit an electrical signal to the first electrical element 2151. The first signal line 219 may be connected to a third conductive pad 214 provided in a first surface (for example, the first surface 211 of FIG. 4) of the first substrate 210. For example, the first ground area 218 may be provided in a portion of layers included in the first substrate 210. The first ground area 218 may be electrically connected to the first conductive structure 230. For example, the first ground area 218 may include a first conductive pad 213 that is provided in the first surface 211 of the first substrate 210. For example, the first conductive pad 213 may be electrically connected to the first conductive structure 230. In various embodiments, the first substrate 210 may include the third mounting area 216 that includes the third electrical element 2161 disposed on the second surface 212. The first electrical element 2151 and the third electrical element 2161 may be individually connected to the first ground area 218 and the first signal line 219.

In an embodiment, the second substrate 220 may include a second signal line 229 and a second ground area 228. For example, the second signal line 229 may be electrically connected to the second electrical element 2251 included on the second mounting area 225 of the second substrate 220. The second signal line 229 may transmit an electrical signal to the second electrical element 2251. The second signal line 229 may be connected to a fourth conductive pad 224 provided in a third surface (for example, the third surface 221 of FIG. 4) of the second substrate 220. For example, the second ground area 228 may be provided in a portion of layers included in the second substrate 220. The second ground area 228 may be electrically connected to the second conductive structure 240. For example, the second ground area 228 may include a second conductive pad 223 provided in surfaces (for example, the third surface 221 and the fourth surface 222) of the second substrate, and the second conductive structure 240 may be electrically connected to the second conductive pad 223. In various embodiments, the second substrate 220 may include the fourth mounting area 226 that includes the fourth electrical element 2261 disposed on the fourth surface 222. Here, the fourth mounting area 226 may include, for example, an area of the fourth surface 222 of the second substrate 220, which is not covered by the first portion 243 of the second conductive structure 240. For example, the second electrical element 2251 and the fourth electrical element 2261 may be individually connected to the second ground area 228 and the second signal line 229.

In an embodiment, the first ground area 218 of the first substrate 210 and the second ground area 228 of the second substrate 220 may be electrically connected to the first conductive structure 230 and the second conductive structure 240. Accordingly, the shielding space 209 may be provided by the first substrate 210, the second substrate 220, the first conductive structure 230, and the second conductive structure 240. For example, the first electrical element 2151, the second electrical element 2251, and the connector 250 may be disposed in the shielding space 209.

In an embodiment, the first conductive structure 230 may include an extension portion 234, which extends from a first surface (for example, the first surface 211 of FIG. 4) of the first substrate 210 toward a third surface (for example, the third surface 221 of FIG. 4) of the second substrate 220, and a support portion 233, which extends from the extension portion 234 toward the shielding space 209. For example, the support portion 233 may come into contact with the third surface 221 of the second substrate 220 and support the second substrate 220. In various embodiments, the support portion 233 may physically come into contact with the second conductive pad 223 of the second substrate 220. Alternatively, the support portion 233 may physically support the second substrate 220, but may be not connected to the second conductive pad 223. However, as the extension portion 234 of the first conductive structure 230 is physically coupled to the second conductive structure 240, the first conductive structure 230 may be connected to the second ground area 228.

In various embodiments, the first conductive structure 230 may include the first inner surface 231 facing the shielding space 209 and the first outer surface 232 opposite to the first inner surface 231, and at least a portion of the extension portion 234 of the first conductive structure 230 may be disposed facing the second inner surface 241 of the second conductive structure 240. For example, the second conductive structure 240 may include the second inner surface 241 facing the first conductive structure 230 and the second outer surface 242 opposite to the second inner surface 241, and the first outer surface 232 of the extension portion 234 of the first conductive structure 230 may be disposed facing the second inner surface 241 of the second portion 244 of the second conductive structure 240. For example, the first conductive structure 230 and the second conductive structure 240 may include the coupling groove 239 and the coupling protrusion 249 accommodated into the coupling groove 239, respectively. For example, the first conductive structure 230 and the second conductive structure 240 may be coupled in shape and separably coupled to each other. Here, the coupling structure of the first conductive structure 230 and the second conductive structure 240 is not limited to that illustrated in the drawing. For example, the second inner surface 241 of the second conductive structure 240 may have a coupling groove, and the first outer surface 232 of the first conductive structure 230 may have a coupling protrusion.

In an embodiment, the second conductive structure 240 may include the first portion 243 disposed on the fourth surface 222 of the second substrate 220 and the second portion 244 extending from the first portion 243 toward the first substrate 210. The first portion 243 may be disposed on a peripheral portion of the fourth surface 222 of the second substrate 220. The first portion 243 is disposed in a partial area of the fourth surface 222 of the second substrate 220, and thus, the remaining areas (for example, the fourth mounting area 226) may be exposed to the outside. Here, the fourth electrical element 2261 may be disposed in the remaining areas. In an embodiment, if the second conductive structure 240 is separated from the first conductive structure 230, the first substrate 210 and the second substrate 220, which are stacked on each other, may become uncoupled.

In an embodiment, the connector 250 may be disposed between the first substrate 210 and the second substrate 220. The connector 250 may be disposed between the first surface 211 of the first substrate 210 and the third surface 221 of the second substrate 220. For example, in an uncoupled state (for example, an uncompressed state, FIGS. 8A and 8B) from the first substrate 210 and the second substrate 220, the connector 250 may have a height greater than a distance between the first substrate 210 and the second substrate 220 (for example, the first direction ① or the second direction ② of FIG. 4, and a height direction H of FIG. 8A). In an embodiment, the connector 250 may be disposed to be press-fitted between the first substrate 210 and the second substrate 220. The press-fitted connector 250 may apply elastic forces to the third conductive pad 214 of the first substrate 210 and the fourth conductive pad 224 of the second substrate 220, and thus, stable electrical connection may be provided.

In an embodiment, both sides of the connector 250 may come into contact with the third conductive pad 214 provided in the first surface 211 of the first substrate 210 and the fourth conductive pad 224 provided in the third surface 221 of the second substrate 220, respectively. The connector 250 may electrically connect the first signal line 219 included in the first substrate 210 to the second signal line 229 included in the second substrate 220.

Figure 7A:
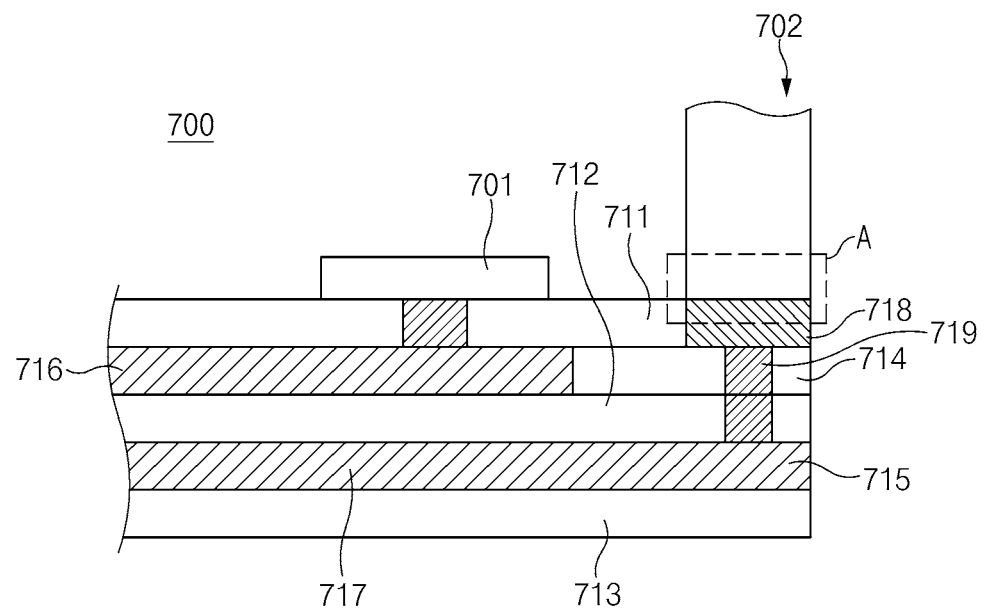
FIGS. 7A and 7B are cross-sectional views of a substrate and a conductive structure of an electronic device according to various embodiments of the disclosure.
Figure 7B:
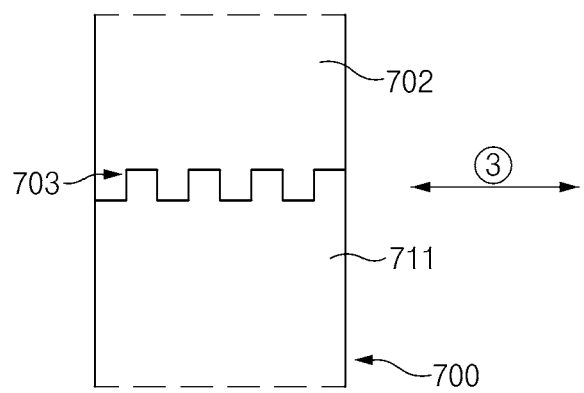

FIGS. 7A and 7B are cross-sectional views of a substrate and a conductive structure of an electronic device according to various embodiments of the disclosure. FIG. 7A is a view illustrating layers and a conductive structure included in a substrate. FIG. 7B is a view illustrating the substrate and the conductive structure.

Referring to FIGS. 7A and 7B, in an embodiment, a substrate (for example, the first substrate 210 and the second substrate 220 of FIG. 6) may include a plurality of insulating layers 711, 712, and 713, and a plurality of metal layers 714 and 715 that are provided between the plurality of insulating layers 711, 712, and 713, respectively, and include a conductive pattern 716. A portion of the plurality of insulating layers 711, 712, and 713 may provide surfaces (for example, the first surface 211, the second surface 212, the third surface 221, and the fourth surface 222 of FIG. 6) of the substrate. The surface (for example, the insulating layer 711) of the substrate 700 may have a conductive pad 718 (for example, the first conductive pad 213 and the second conductive pad 223 of FIG. 6). The first conductive pad 718 may be electrically connected to a conductive structure 702.

In an embodiment, the substrate 700 may include a ground area (for example, the first ground area 218 and the second ground area 228 of FIG. 6) and a conductive pattern 716 (for example, the first signal line 219 and the second signal line 229 of FIG. 6) to which an electrical signal is applied. In the embodiment, a ground area 717 may be provided in at least one layer 715 of the plurality of metal layers 714 and 715. The conductive pattern 716 may be provided in at least one layer 714 of the plurality of metal layers 714 and 715.

In an embodiment, on the surface of the substrate 700, there may be disposed an electrical element 701 (for example, the first electrical element 2151 and the second electrical element 2251 of FIG. 6) and a conductive structure 702 (for example, the first conductive structure 230 and the second conductive structure 240 of FIG. 6). In an embodiment, the electrical element 701 may be electrically connected to the conductive pattern 716. In an embodiment, the electrical element 701 may be electrically connected to the ground area 717. For example, the conductive structure 702 may be connected to the ground area 717 through a via 719. For example, the via 719 may be provided passing through a portion of the insulating layers 711, 712, and 713 and/or the metal layers 714 and 715.

In various embodiments, in order to be electrically connected to the conductive pad 718, the conductive structure 702 may be mounted on the surface of the substrate 700.

Referring to FIG. 7B, recess and protrusion structures 703 corresponding to each other may be provided in the surface (for example, the insulating layer 711) of the substrate 700 and the conductive structure 702. For example, the recess and protrusion structures 703 may fix the conductive structure 702 to the substrate. For example, the conductive structure 702 may be fixed by the recess and protrusion structures 703 and not allowed to move in a third direction (for example, the horizontal direction). Here, the third direction may represent a direction perpendicular to the first direction ① and the second direction ② illustrated in FIG. 4. Accordingly, a short circuit may be prevented from occurring between conductive areas (for example, conductive areas 254 of FIGS. 8A and 8B) included in a connector (for example, a connector 250 of FIGS. 8A and 8B).

Figure 8A:
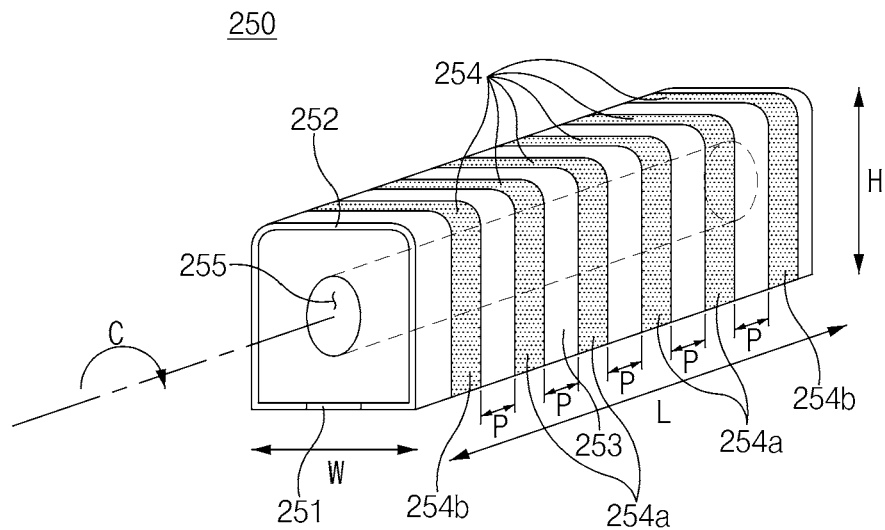
FIGS. 8A and 8B are views illustrating a connector of an electronic device according to various embodiments of the disclosure.
Figure 8B:
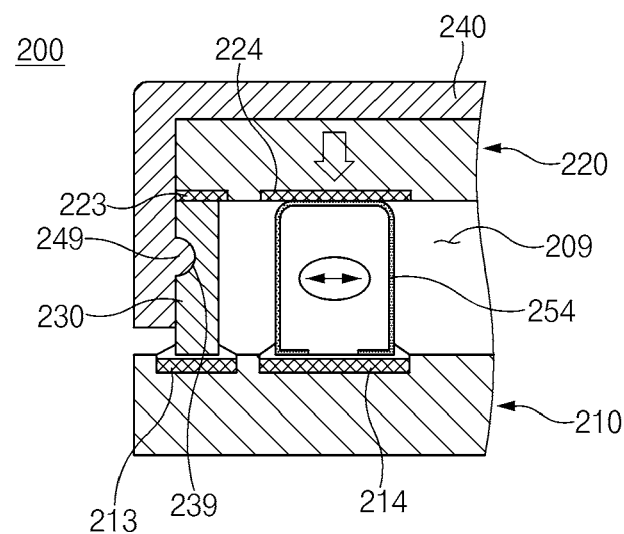

FIGS. 8A and 8B are views illustrating a connector (for example, the connector 250 of FIG. 6) of an electronic device according to various embodiments of the disclosure. FIG. 8A illustrates a connector 250 of the electronic device according to an embodiment of the disclosure, and FIG. 8B illustrates a substrate stacking structure 200 in which the connector 250 is disposed according to an embodiment of the disclosure.

Referring to FIG. 8A, at least one of components of the substrate stacking structure 200 according to an embodiment is identical or similar to at least one of the components of the substrate stacking structure 600 of FIG. 6, and thus, the duplicated description thereof will be omitted hereinafter.

Referring to FIG. 8B, the first conductive structure 230 and the second conductive structure 240 may surround a space between the first substrate 210 and the second substrate 220. The first conductive structure 230 and the second conductive structure 240 may be coupled to each other as the coupling protrusion 249 of the second conductive structure 240 is accommodated into the coupling groove 239 of the first conductive structure 230. The first conductive structure 230 may be connected to the first conductive pad 213 of the first substrate 210 and the second conductive pad 223 of the second substrate 220. The connector 250 may be disposed in the space between the first substrate 210 and the second substrate 220.

In an embodiment, the connector 250 may include a lower surface 251 in contact with the third conductive pad 214 of the first substrate 210, an upper surface 252 in contact with the fourth conductive pad 224 of the second substrate 220, and a side surface 253 provided between the upper surface 252 and the lower surface 251.

In an embodiment, the surface of the connector 250 may include a plurality of conductive areas 254. Each of the plurality of conductive areas 254 may extend along a circumferential direction C of the connector 250. Here, the circumferential direction C may be defined as a direction which starts from the lower surface 251 in one direction, passes through the side surface 253 and the upper surface 252, and returns to the lower surface 251. Each of the plurality of conductive areas 254 may be arranged in a longitudinal direction L of the connector. Here, one conductive area may be spaced a predetermined pitch distance P from a neighboring conductive area. The conductive areas 254 may be insulated from each other in order to transmit different electrical signals.

In various embodiments, the connector 250 may include a through-hole 255 that passes through side surfaces on both side in the longitudinal direction. For example, the through-hole 255 may extend in a longitudinal direction L. In a coupled state (for example, FIG. 6) with a first substrate (for example, the first substrate 210 of FIG. 6) and a second substrate (for example, the second substrate 220 of FIG. 6), the connector 250 may be pressed in a height direction H. In various embodiments, in the coupled state (for example, FIG. 6) with the first substrate and the second substrate, the connector 250 may be flexible so that a diameter of the through-hole 255 is deformed (for example, increasing in a width direction W).

In various embodiment, in the coupled state (for example, FIG. 6) with a first substrate (for example, the first substrate 210 of FIG. 6) and a second substrate (for example, the second substrate of FIG. 6), the connector 250 may have a first height. In an uncoupled state (for example, FIGS. 8A and 8B) from the first substrate and the second substrate, the connector 250 may have a second height greater than the first height. In various embodiments, in a state (for example, FIG. 6) in which the connector 250 is coupled to the first substrate and the second substrate, the through-hole 255 may maximize a difference between the first height and the second height. For example, the through-hole 255 may improve a compressibility of the connector 250.

In an embodiment, the connector 250 may be surface-mounted on one of the first substrate 210 or the second substrate 220. In various embodiments, the surface on which the connector 250 is mounted may be one of the first surface 211 of the first substrate 210 and the third surface 221 of the second substrate 220. According to an embodiment, the connector 250 may have the first height. Here, the first height may be greater than a distance between the first substrate 210 and the second substrate 220. Thus, as the first substrate 210 and the second substrate 220 are stacked, the connector 250 may be pressed in the height direction H and elongated in the width direction W, corresponding to the distance between the first substrate 210 and the second substrate 220. That is, the connector 250 may be press-fitted between the first substrate 210 and the second substrate 220. Accordingly, the conductive areas 254 of the connector 250 may be firmly coupled to the third conductive pad 214 of the first substrate 210 and the fourth conductive pad 224 of the second substrate 220.

In various embodiments, some of the conductive areas 254 may be connected to signal lines (for example, the signal lines 219 and 229 of FIG. 6) included in the substrates 210 and 220. Some of the conductive areas 254 may be connected to ground areas (for example, the ground areas 218 and 228 of FIG. 6) included in the substrates 210 and 220.

In various embodiments, the conductive areas 254 may include second conductive areas 254b provided on both ends of the connector 250 in the longitudinal direction L and first conductive areas 254a provided between the second conductive areas 254b. Here, the first conductive areas 254a may be connected to signal lines (for example, the signal lines 219 and 229 of FIG. 6), and the second conductive areas 254b may be connected to ground areas (for example, the ground areas 218 and 228 of FIG. 6). In various embodiments, the arrangement of the first conductive areas 254a and the second conductive areas 254b is not limited to that illustrated in the drawing. For example, the first conductive areas 254a connected to the signal lines (for example, the signal lines 219 and 229 of FIG. 6) may be provided on both ends in the longitudinal direction L, and the second conductive areas 254b connected to the ground areas (for example, the ground areas 218 and 228 of FIG. 6) may be provided between the first conductive areas 254a.

The substrate stacking structure 200 disclosed in the disclosure is not necessarily limited to including the connector 250 illustrated in FIGS. 8A and 8B, but may include various types of connectors commonly used in the art.

FIGS. 9A and 9B are views illustrating a connector of an electronic device according to various embodiments of the disclosure.

In an embodiment, connectors 910 and 920 may include a first connector 910 illustrated in FIG. 9A and a second connector 920 illustrated in FIG. 9B and connected to the first connector 910.

In an embodiment, the first connector 910 may be disposed in one of a first substrate (for example, the first substrate 210 of FIG. 6) or a second substrate (for example, the second substrate 220 of FIG. 6), and the second connector 920 may be disposed in the other. For example, the first connector 910 may include a first insulating member 911 and a plurality of conductive pins 912 and 913 protruding from a surface of the first insulating member 911. The plurality of conductive pins 912 and 913 may be accommodated into a plurality of conductive holes 922 and 923, respectively, provided in the second connector 920. For example, the plurality of conductive pins 912 and 913 may provide electrical connection between a first substrate (for example, the first substrate 210 of FIG. 6) and a second substrate (for example, the second substrate 220 of FIG. 6). The plurality of conductive pins 912 and 913 may be connected to a first signal line (for example, the first signal line 219 of FIG. 6) included in the first substrate and a second signal line (for example, the signal line 229 of FIG. 6) included in the second substrate.

In various embodiments, the second connector 920 may include a second insulating member 921 and a plurality of conductive holes 922 and 923 provided in a surface of the second insulating member 921. For example, the plurality of conductive holes 922 and 923 may be internally plated or include therein conductive terminals. The plurality of conductive holes 922 and 923 may include first conductive holes 922 into which first conductive pins 912 are accommodated and second conductive holes 923 into which second conductive pins 913 are accommodated.

In various embodiments, the plurality of conductive pins 912 and 913 provided in the first connector 910 may include the first conductive pins 912 to which an electrical signal is applied and the second conductive pins 913 to which a ground signal is applied. For example, the first conductive pins 912 may be connected to signal lines (for example, the first signal line 219 and the second signal line 229 of FIG. 6) included in substrates (for example, the first substrate 210 and the second substrate 220 of FIG. 6). For example, the second conductive pins 913 may be connected to ground areas (for example, the first ground area 218 and the second ground area 228 of FIG. 6) included in the substrates.

In various embodiments, the second conductive pins 913 may be provided at ends of the first connector 910. For example, the first conductive pins 912 may be disposed between the second conductive pins 913. However, the arrangement of the plurality of conductive pins 912 and 913 is not limited to that illustrated in the drawing. For example, the second conductive pins 913 to which the ground signal is applied may be disposed between the first conductive pins 912.

In one embodiment, the plurality of conductive holes 922 and 923 may include the first conductive holes 922 to which an electrical signal is applied and the second conductive holes 923 to which a ground signal is applied. The second conductive holes 923 may be provided at ends of second connector 920. The first conductive holes 922 may be disposed between the second conductive holes 923. However, the arrangement of the plurality of conductive holes 922 and 923 is not limited to that illustrated in the drawing. For example, the second conductive holes 923 to which the ground signal is applied may be disposed between the first conductive holes 922.

In various embodiments, without the second connector 920, only the first connector 910 may be solely disposed in one of a first substrate (for example, the first substrate 210 of FIG. 6) or a second substrate (for example, the second substrate 220 of FIG. 6). In various embodiments, the plurality of conductive pins 912 and 913 of the first connector 910 may include pogo pins having elasticity in a protruding direction. Here, the plurality of conductive pins 912 and 913 may be pressed by a first substrate (for example, the first substrate 210 of FIG. 6) or a second substrate (for example, the second substrate 220 of FIG. 6).

Figure 10:
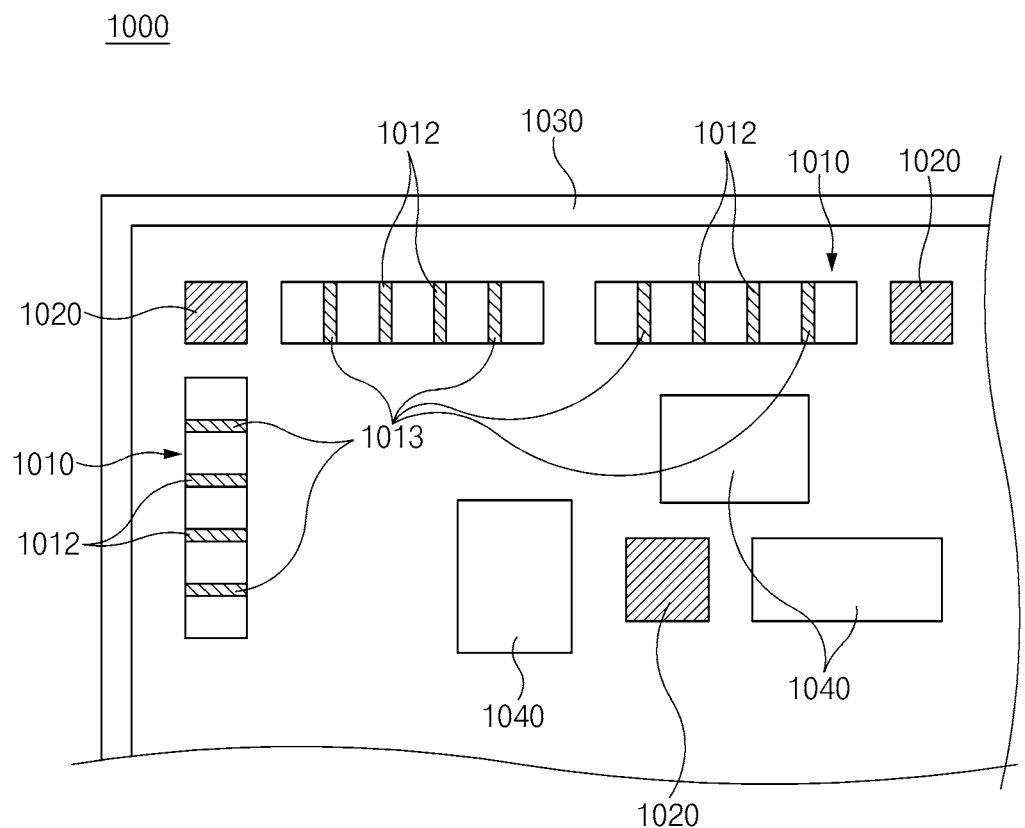
FIG. 10 is a plan view illustrating a substrate of an electronic device according to an embodiment of the disclosure.

FIG. 10 is a view illustrating a first substrate of an electronic device according to an embodiment of the disclosure.

Referring to FIG. 10, a substrate 1000 may include the first substrate 210 or the second substrate 220 illustrated in FIGS. 4 to 8B. A first connector 1010 illustrated in FIG. 10 may include the connector 250 illustrated in FIGS. 4 to 9B.

In an embodiment, in the substrate 1000, there may be disposed first connectors 1010, second connectors 1020, and electrical elements 1040 (for example, the first electrical element 2151 and the second electrical element 2251 of FIG. 4).

In an embodiment, the substrate 1000 may include a conductive structure 1030. For example, the conductive structure 1030 may include a first conductive structure (for example, the first conductive structure 230 of FIG. 5) or a second conductive structure (for example, the second conductive structure 240 of FIG. 5).

In an embodiment, each of the first connectors 1010 may include a plurality of conductive areas 1012 and 1013 (for example, the conductive areas 254 of FIG. 8). The first connector 1010 may be connected to signal lines (for example, the first signal line 219 and the second signal line 229 of FIG. 6) included in the substrate 1000.

In various embodiments, some of the plurality of conductive areas 1012 and 1013 may be connected to the signal lines, and others may be connected to ground areas (for example, the first ground area 218 and the second ground area 228 of FIG. 6). For example, the plurality of conductive areas 1012 and 1013 may include first conductive areas 1012 connected to the signal lines of the substrate 1000 and second conductive areas 1013 connected to the ground areas. In various embodiments, the first conductive areas 1012 may be disposed between the second conductive areas 1013. However, the arrangement of the first conductive areas 1012 and the second conductive areas 1013 is not limited to that illustrated in the drawing.

In an embodiment, a ground signal may be applied to each of the second connectors 1020. The second connectors 1020 may be connected to the ground areas (for example, the first ground area 218 and the second ground area 228 of FIG. 6) included in the substrate. Here, the second connector may be disposed between the electrical elements 1040. For example, the second connector 1020 may be disposed adjacent to an electrical element (for example, a processor) consuming relatively high electric power among the electrical elements 1040 or an electrical element requiring a short path to a ground.

Figure 11A:
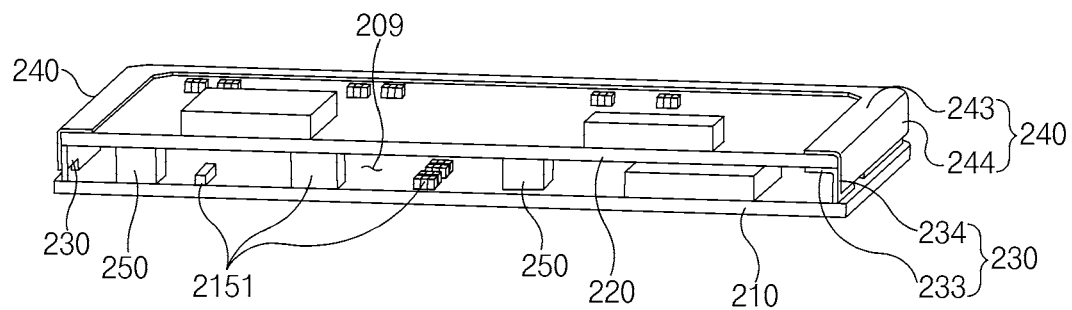
FIGS. 11A and 11B are views illustrating a structure for stacking substrates of an electronic device according to an embodiment of the disclosure.
Figure 11B:
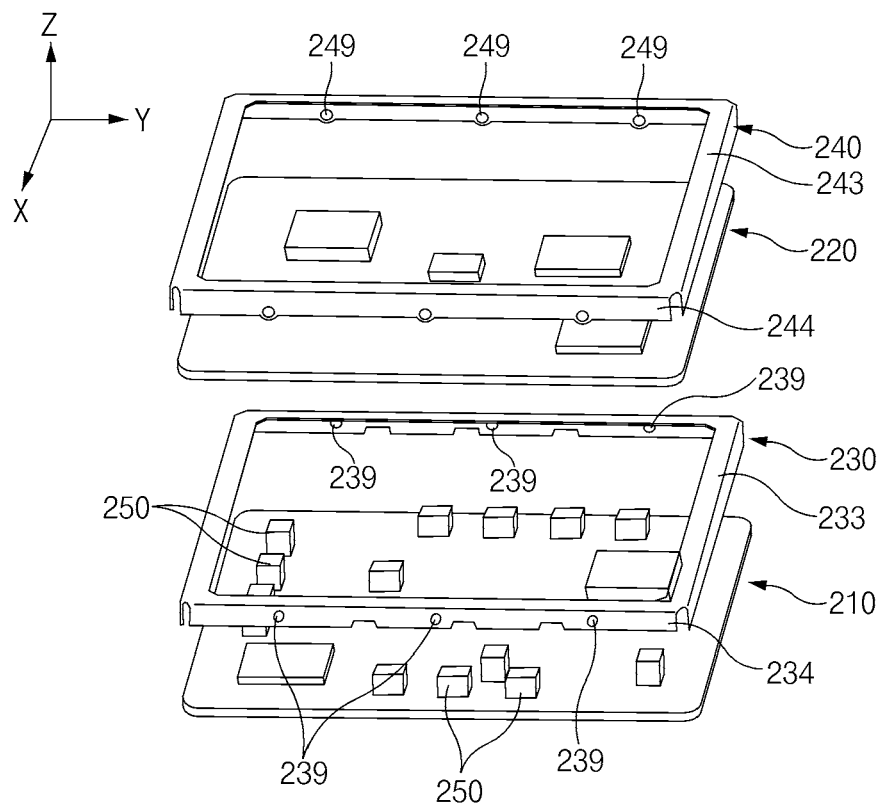

FIGS. 11A and 11B are views illustrating a structure for stacking substrates of an electronic device according to an embodiment of the disclosure.

Referring to FIGS. 11A and 11B, in an embodiment, the electronic device may include a first substrate 210, a second substrate 220, a first conductive structure 230, and a second conductive structure 240. A shielding space 209 may be provided by the first substrate 210, the second substrate 220, the first conductive structure 230, and the second conductive structure 240. For example, one or more electrical elements 2151 and one or more connectors 250 may be disposed within the shielding space 209. For example, the electrical elements 2151 and the connectors 250 may be disposed on the first substrate 210.

In an embodiment, the first conductive structure 230 may be surface-mounted on the first substrate 210, and thus, the position thereof may be fixed. The positions of the first conductive structure 230 and the second conductive structure 240 may be fixed as coupling protrusions 249 provided in the second conductive structure 240 are accommodated into coupling grooves 239 provided in the first conductive structure 230. For example, the coupling protrusions 249 and the coupling grooves 239 may constrain the positions of the first conductive structure 230 and the second conductive structure 240 in a horizontal direction (for example, an x axis and a y axis) and in a vertical direction (for example, a z axis).

In an embodiment, the second conductive structure 240 may include a first portion 243 disposed on a surface of the second substrate 220 and a second portion 244 surrounding at least a portion of an edge of the second substrate 220. The first conductive structure 230 may include a support portion 233 disposed on a surface of the second substrate 220 and an extension portion 234 mounted on a surface of the first substrate 210. In an embodiment, the coupling protrusions 249 may be provided in the second portion 244 of the second conductive structure 240, and the coupling grooves 239 may be provided in the extension portion 234 of the first conductive structure 230. In an embodiment, although not illustrated, coupling grooves may be provided in the second portion 244 of the second conductive structure 240, and coupling protrusions may be provided in the extension portion 234 of the first conductive structure 230.

In an embodiment, the second substrate 220 may be disposed between the support portion 233 of the first conductive structure 230 and the first portion 243 of the second conductive structure 240. Also, the edge of the second substrate 220 may be surrounded by the second portion 244 of the second conductive structure 240. Accordingly, the positions of the first conductive structure 230, the second conductive structure 240, the first substrate 210, and the second substrate 220 may be fixed.

Figure 12:
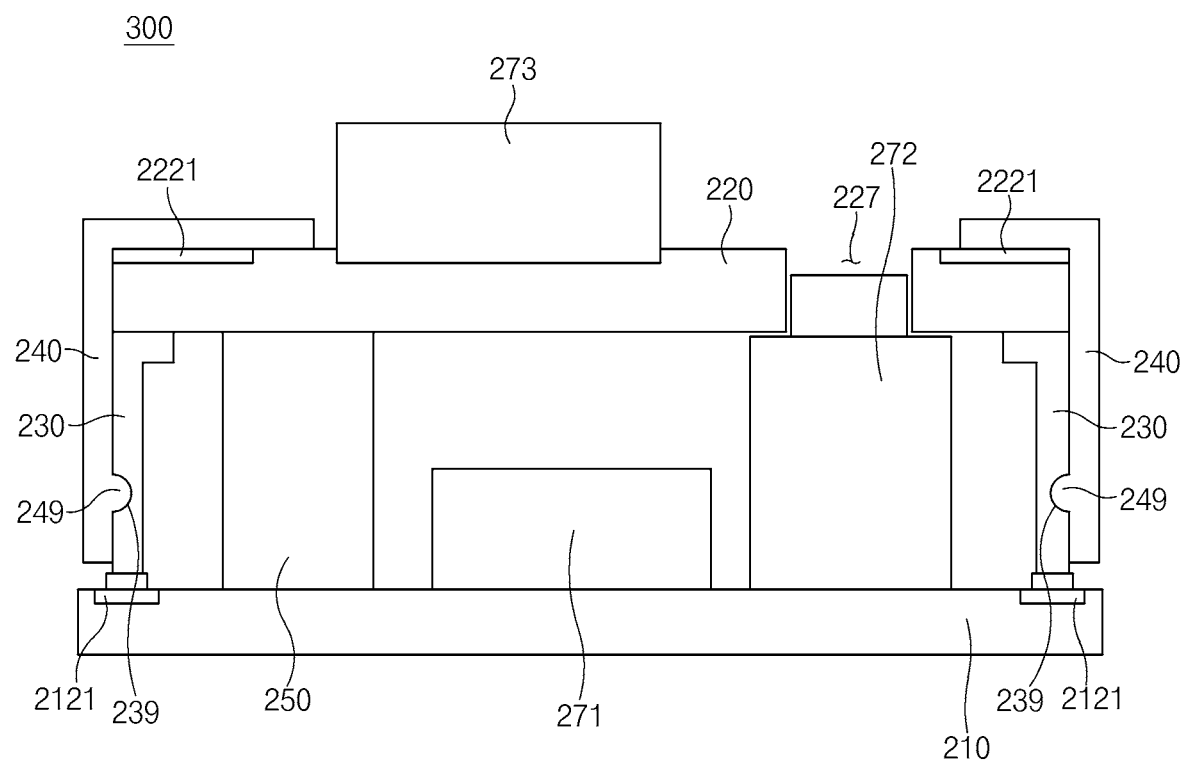
FIG. 12 is a cross-sectional view illustrating a camera module of an electronic device according to an embodiment of the disclosure.

FIG. 12 is a view illustrating a structure for stacking substrates in a camera module of an electronic device according to an embodiment of the disclosure.

Referring to FIG. 12, in an embodiment, camera modules (for example, the camera modules 105, 112, and 113 of FIGS. 1 and 2) may include the substrate stacking structures (for example, the substrate stacking structure 200 of FIG. 4 and the substrate stacking structure 600 of FIG. 6) disclosed in the disclosure.

In an embodiment, the camera modules may include at least one of a wide angle camera, a telephoto camera, an IR camera (for example, a time of flight (TOF) camera or a structured light camera).

In the illustrated camera, a camera module 300 may include a TOF camera module that includes a substrate stacking structure (for example, the substrate stacking structure 200 of FIG. 4 and the substrate stacking structure 600 of FIG. 6), a control circuit 271, a light emitting unit 273, and a light receiving unit 272.

In an embodiment, the light emitting unit 273 may be configured to transmit light to the outside (for example, a front surface or a rear surface) of an electronic device (for example, the electronic device 100 of FIG. 1). The light receiving unit 272 may be configured, for example, to receive the light being incident to the electronic device. The control circuit 271 may be configured to control the light emitting unit 273 and/or the light receiving unit 272. For example, the light emitting unit 273 may be configured to transmit the light as a pulse having a predetermined period, and the control circuit 271 may be configured to control the pulse (for example, the period of pulse). For example, the control circuit 271 may detect the distance to an object, based on an optical signal incident through the light receiving unit 272.

In an embodiment, the control circuit 271 and the light receiving unit 272 may be mounted on a first substrate 210. The light emitting unit 273 may be mounted on the second substrate 220. An opening 227 may be provided in the second substrate 220. The light reflected from the object may be incident to the light receiving unit 272 through the opening 227.

In an embodiment, the light receiving unit 272, the light emitting unit 273, the control circuit 271 may be electrically connected to each other. The light receiving unit 272 may be connected to the control circuit 271 by a signal line (for example, the first signal line 219 of FIG. 6) included in the first substrate 210. A connector 250 may electrically connect the light emitting unit 273 disposed on the second substrate 220 to the control circuit 271 disposed on the first substrate 210. The connector 250 may electrically connect a signal line (for example, the second signal line 229 of FIG. 6) included in the second substrate 220 to a signal line (for example, the first signal line 219 of FIG. 6) included in the first substrate 210.

In an embodiment, an element that generates a relatively larger amount of heat than an element disposed on the first substrate 210 may be disposed on the second substrate 220. For example, in the camera module 300, the light emitting unit 273 may have higher power consumption than the light receiving unit 272 or the control circuit 271, and thus may generate a relatively larger amount of heat. As the light emitting unit 273 is disposed in the second substrate 220, it may be advantageous to radiate heat compared to being disposed in the first substrate 210.

In an embodiment, the first substrate 210 may include a first conductive pad 2121. The first conductive pad 2121 may be electrically connected to a first ground area (for example, the first ground area 218 of FIG. 6) of the first substrate 210. A first conductive structure 230 may be electrically connected to the first conductive pad 2121. The second substrate 220 may include a second conductive pad 2221. The second conductive pad 2221 may be electrically connected to a second ground area (for example, the second ground area 228 of FIG. 6) of the second substrate 220. A second conductive structure 240 may be electrically connected to the second conductive pad 2221. The first conductive structure 230 may be electrically connected to the second conductive structure 240. For example, the first conductive structure 230 and the second conductive structure 240 may be coupled to each other as a coupling protrusion 249 provided in the second conductive structure 240 is accommodated into a coupling groove 239 provided in the first conductive structure 230. Accordingly, the space between the first substrate 210 and the second substrate 220 may be shielded by the ground.

An electronic device 100 according to embodiments disclosed in the disclosure may include: a first substrate 210 on which first electrical elements 2151 and 2161 and a first conductive structure 230, which is configured to surround the first electrical elements 2151 and 2161, are disposed; a second substrate 220 on which second electrical elements 2251 and 2261 and a second conductive structure 240, which is separably connected to the first conductive structure 230, are disposed; and a connector 250 which is disposed between the first substrate 210 and the second substrate 220 and electrically connects the first electrical elements 2151 and 2161 to the second electrical elements 2251 and 2261.

In various embodiments, one of one side surface of the first conductive structure 230 or one side surface of the second conductive structure 240 may have a coupling protrusion 249 that protrudes toward the other, and the other may have a coupling groove 239 into which the coupling protrusion is accommodated.

In various embodiments, the connector 250 may include at least one ground.

In various embodiments, the connector 250 may include a plurality of conductive areas 254, and the plurality of conductive areas 254 may be spaced a predetermined distance from each other.

In various embodiments, the second conductive structure 240 may surround the first conductive structure 230.

An electronic device 100 according to embodiments disclosed in the disclosure may include: a first substrate 210 including a first mounting area 215 on which a first electrical element 2151 is disposed, a first signal line 219 electrically connected to the first electrical element 2151, and a first ground area 218; a first conductive structure 230 provided on the first substrate 210 in order to surround at least a portion of the first mounting area 215 and electrically connected to the first ground area 218; a second substrate including a second signal line 229 and a second ground area 228 and stacked above the first substrate 210 in order to face the first mounting area 215; a second conductive structure 240 coupled to at least a portion of a peripheral portion of the second substrate 220, electrically connected to the second ground area 228, and separably coupled to the first conductive structure 230; and a connector 250 provided on at least one of the first mounting area 215 or the second substrate 220 and electrically connecting the first signal line 219 of the first substrate 210 to the second signal line 229 of the second substrate 220.

In various embodiments, the first conductive structure 230, the second conductive structure 240, the first ground area 218, and the second ground area 228 may define a shielding space 209, the first conductive structure 230 may include a first inner surface 231 facing the shielding space 209 and a first outer surface 232 opposite to the first inner surface 231, and the second conductive structure 240 may include a second inner surface 241 facing the shielding space 209 and a second outer surface 242 opposite to the second inner surface 241, wherein one of the first outer surface 232 of the first conductive structure 230 or the second inner surface 241 of the second conductive structure 240 has a coupling protrusion 249 that protrudes toward the other, and the other has a coupling groove 239 into which the coupling protrusion is accommodated.

In various embodiments, the first conductive structure 230 may be mounted on a surface of the first substrate 210.

In various embodiments, the second substrate 220 may include a second mounting area 225 on which a second electrical element 2251 is disposed, and at least a portion of the second mounting area 225 may face the first mounting area 215.

In various embodiments, the first substrate 210 may include a first surface 211 on which a portion of the first mounting area 215 is defined and a second surface 212 opposite to the first surface 211, the second substrate may include a third surface 221 facing the first surface 211 and a fourth surface 222 opposite to the third surface 221, and the second conductive structure 240 may extend from at least a portion of the fourth surface 222 toward the first surface 211 of the first substrate 210.

In various embodiments, the first conductive structure 230 may be mounted on the first surface 211 of the first substrate 210 and may be in contact with a partial area of the third surface 221 of the second substrate 220.

In various embodiments, the second conductive structure 240 may include a first portion 243 which is disposed on the fourth surface 222 of the second substrate 220 and a second portion 244 which extends from an edge of the fourth surface 222 toward the first surface 211 of the first substrate 210 and is coupled to the first conductive structure 230.

In various embodiments, the first conductive structure 230, the second conductive structure 240, the first ground area 218, and the second ground area 228 may define a shielding space, and the first conductive structure 230 may be disposed closer to the shielding space than the second portion 244 of the second conductive structure 240.

In various embodiments, the connector 250 may include a first connector 250-1 provided in the first substrate 210 and a second connector 250-2 provided in the second substrate 220, and one of the first connector 250-1 or the second connector 250-2 may include a conductive pin that extends toward the other, and the other may have a hole into which the conductive pin is inserted.

In various embodiments, the connector 250 may be compressible in order to be press-fitted between a third conductive pad 214 of the first substrate 210 and a fourth conductive pad 224 of the second substrate 220.

In various embodiments, the connector 250 may include an opening provided therein and extending in a longitudinal direction and a plurality of conductive areas 254 provided on a surface thereof.

In various embodiments, the plurality of conductive areas 254 may be spaced a predetermined distance P in the longitudinal direction, and each of the plurality of conductive areas 254 may be provided along the surface in a direction perpendicular to the longitudinal direction.

An electronic device according to embodiments disclosed in the disclosure may include: a first substrate 210 including a first surface 211 and a second surface 212 opposite to the first surface 211; a second substrate 220 including a third surface 221 and a fourth surface 222 opposite to the third surface 221, the second substrate 220 being disposed so that the third surface 221 faces the first surface 211; a first conductive structure 230 provided on the first surface 211, extending from the first surface 211 to the third surface 221, and surrounding at least a partial area of the first surface 211; and a second conductive structure 240 including a first portion 243 disposed on at least a portion of the fourth surface 222 and a second portion 244 extending from the first portion 243 toward the first surface 211, wherein the second portion 244 is coupled to the first conductive structure 230, wherein the second portion 244 has a coupling protrusion 249 that protrudes toward the first conductive structure 230, and wherein the first conductive structure 230 has a coupling groove 239 into which the coupling protrusion is accommodated.

In various embodiments, the electronic device may include a connector which is disposed between the first substrate 210 and the second substrate 220 and electrically connects the first substrate 210 to the second substrate 220.

In various embodiments, the first conductive structure 230 may be electrically connected to a first ground area 218 defined in the first substrate 210, and the second conductive structure 240 may be electrically connected to a second ground area 228 defined in the second substrate 220.

In the electronic device according to the embodiments disclosed in the disclosure, the positions of the first substrate and the second substrate are determined, and thus, the signal lines of the first substrate are electrically connected to the signal lines of the second substrate. Also, since the first substrate and the second substrate are separably connected to each other, maintenance may be easily performed later. Also, since the connector is press-fitted between the first substrate and the second substrate, accuracy in connection may be improved during an assembly operation.

Various other effects, which are found directly or indirectly from the disclosure, may be provided.

It should be appreciated that various embodiments of the disclosure and the terms used herein are not intended to limit the technological features set forth herein to particular embodiments and include various modifications, equivalents, and alternatives for a corresponding embodiment. With regard to the description of the drawings, similar reference numerals may be used to refer to similar elements. As used herein, each of such phrases as "A or B", "at least one of A and/or B", "A, B, or C", or "at least one of A, B, and/or C" may include all possible combinations of the items enumerated together. Terms such as "1st" and "2nd", or "first" and "second" may modify corresponding elements irrespective of importance or order, and are only used to distinguish one element from another element and do not limit the corresponding elements. If an element (e.g., a first element) is referred to as "being (functionally or communicatively) connected" or "being coupled" to another element (e.g., a second element), the element may be directly connected to another element or connected thereto with another element (e.g., a third element).

As used herein, an expression "adapted to or configured to" may be interchangeably used with, for example in hardware or software manner, "suitable for", "having the capacity to", "modified to", "made to", "capable of", or "designed to" according to a situation. In any situation, an expression of a "device configured to" may mean that the device is "capable of" in conjunction with another device or component. For example, an expression of a "processor adapted (or configured) to perform A, B, and C" may be a specialty processor (e.g., an embedded processor) for performing corresponding operations or a general purpose processor (e.g., central processing unit (CPU) or AP) capable of performing corresponding operations by executing one or more programs stored in a memory device.

As used herein, the term "module" may include a unit implemented with hardware, software, or firmware, and may interchangeably be used with other terms, for example, logic, a logic block, a component, or a circuit. The "module" may be a single integrated component, or a minimum unit or a part thereof adapted to perform one or more functions. The "module" may be implemented mechanically or electronically and may include, for example, an application-specific IC (ASIC) chip, a field-programmable gate array (FPGA), or a programmable-logic device for performing some operations, which are known or will be developed.

According to various embodiments, at least a part of an apparatus (e.g., modules or functions thereof) or a method (e.g., operations) may be, for example, implemented by commands stored in a computer-readable storage media in the form of a program module. If the commands are executed by a processor, the processor may perform a function corresponding to the instruction. The computer-readable recording medium may include a hard disk, a floppy disk, a magnetic media (e.g., a magnetic tape), an optical media (e.g., compact disc read-only memory (CD-ROM), digital video disc (DVD), and a magneto-optical media (e.g., a floptical disk)), an embedded memory, and so on. Further, the command may include a code generated by a compiler or a code executable by an interpreter.

Each of components (e.g., modules or programming modules) according to various embodiments may include a single or a plurality of sub-components, and some sub-components among the aforementioned sub-components may be omitted and another sub-component may be further included. Alternatively or additionally, some components (e.g., modules or programming modules) may be integrated into a single component, and may perform, in the same or similar manner, a function which has been performed by each of the components prior to the integration. The operations performed by the module, the programming module, or another component according to various embodiments may be carried out sequentially, in parallel, repeatedly, or heuristically, or at least some of the operations may be executed in a different order or omitted, or other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a first substrate on which a first electrical element and a first conductive structure, which is configured to surround the first electrical element, are disposed;
a second substrate on which a second electrical element and a second conductive structure, which is separably connected to the first conductive structure, are disposed; and
a connector which is disposed between the first substrate and the second substrate and electrically connects the first electrical element to the second electrical element,
wherein the first substrate comprises a first surface on which the first conductive structure is disposed and a second surface opposite to the first surface,
wherein the second substrate comprises a third surface facing the first surface and a fourth surface opposite to the third surface,
wherein the first conductive structure is in contact with a partial area of the third surface of the second substrate, and the second conductive structure extends from at least a portion of the fourth surface of the second substrate toward the first surface of the first substrate,
wherein first recess and protrusion structures corresponding to each other are provided in the first surface of the first substrate and one surface of the first conductive structure that are in contact with each other,
wherein second recess and protrusion structures corresponding to each other are provided in the fourth surface of the second substrate and one surface of the second conductive structure that are in contact with each other, and
wherein the first recess and protrusion structures fix the first conductive structure to the first substrate, and the second recess and protrusion structures fix the second conductive structure to the second substrate.

2. The electronic device of claim 1,
wherein one of one side surface of the first conductive structure or one side surface of the second conductive structure has a coupling protrusion that protrudes toward the other, and
wherein the other has a coupling groove into which the coupling protrusion is accommodated.

3. The electronic device of claim 1, wherein the connector comprises at least one ground.

4. The electronic device of claim 1,
wherein the connector comprises a plurality of conductive areas, and
wherein the plurality of conductive areas are spaced a predetermined distance from each other.

5. The electronic device of claim 1, wherein the second conductive structure surrounds the first conductive structure.

6. An electronic device comprising:
a first substrate comprising a first mounting area on which a first electrical element is disposed, a first signal line electrically connected to the first electrical element, and a first ground area;
a first conductive structure provided on the first substrate in order to surround at least a portion of the first mounting area and electrically connected to the first ground area;
a second substrate comprising a second signal line and a second ground area and stacked above the first substrate in order to face the first mounting area;
a second conductive structure coupled to at least a portion of a peripheral portion of the second substrate, electrically connected to the second ground area, and separably coupled to the first conductive structure; and
a connector provided on at least one of the first mounting area or the second substrate and configured to electrically connect the first signal line of the first substrate to the second signal line of the second substrate,
wherein the first substrate comprises a first surface on which a portion of the first mounting area is defined and a second surface opposite to the first surface,
wherein the second substrate comprises a third surface facing the first surface and a fourth surface opposite to the third surface,
wherein the first conductive structure is mounted on the first surface of the first substrate and is in contact with a partial area of the third surface of the second substrate, and the second conductive structure extends from at least a portion of the fourth surface of the second substrate toward the first surface of the first substrate,
wherein first recess and protrusion structures corresponding to each other are provided in the first surface of the first substrate and one surface of the first conductive structure that are in contact with each other,
wherein second recess and protrusion structures corresponding to each other are provided in the fourth surface of the second substrate and one surface of the second conductive structure that are in contact with each other, and
wherein the first recess and protrusion structures fix the first conductive structure to the first substrate, and the second recess and protrusion structures fix the second conductive structure to the second substrate.

7. The electronic device of claim 6,
wherein the first conductive structure, the second conductive structure, the first ground area, and the second ground area define a shielding space,
wherein the first conductive structure comprises:
a first inner surface facing the shielding space, and
a first outer surface opposite to the first inner surface,
wherein the second conductive structure comprises:
a second inner surface facing the shielding space, and
a second outer surface opposite to the second inner surface,
wherein one of the first outer surface of the first conductive structure or the second inner surface of the second conductive structure has a coupling protrusion that protrudes toward the other, and
wherein the other of the first outer surface of the first conductive structure or the second inner surface of the second conductive structure has a coupling groove into which the coupling protrusion is accommodated.

8. The electronic device of claim 6, wherein the second substrate comprises:
a second mounting area on which a second electrical element is disposed, and
at least a portion of the second mounting area faces the first mounting area.

9. The electronic device of claim 6, wherein the second conductive structure comprises:
a first portion which is disposed on the fourth surface of the second substrate; and
a second portion which extends from an edge of the fourth surface toward the first surface of the first substrate and is coupled to the first conductive structure.

10. The electronic device of claim 9,
wherein the first conductive structure, the second conductive structure, the first ground area, and the second ground area define a shielding space, and
wherein an inner surface of the first conductive structure is disposed closer to the shielding space than an inner surface of the second portion of the second conductive structure.

11. The electronic device of claim 6,
wherein the connector comprises:
a first connector provided in the first substrate, and
a second connector provided in the second substrate, and
wherein one of the first connector or the second connector comprises a conductive pin that extends toward the other, and the other has a hole into which the conductive pin is inserted.

12. The electronic device of claim 6, wherein the connector is compressible in order to be press-fitted between a first conductive pad of the first substrate and a second conductive pad of the second substrate.

13. The electronic device of claim 6, wherein the connector comprises an opening provided therein and extending in a longitudinal direction and a plurality of conductive areas provided on a surface thereof.

14. The electronic device of claim 13,
wherein the plurality of conductive areas are spaced a predetermined distance in the longitudinal direction, and
wherein each of the plurality of conductive areas is provided along the surface in a direction perpendicular to the longitudinal direction.

15. An electronic device comprising:
a first substrate comprising a first surface and a second surface opposite to the first surface;
a second substrate comprising a third surface and a fourth surface opposite to the third surface, the second substrate being disposed so that the third surface faces the first surface;
a connector disposed between the first surface of the first substrate and the third surface of the second substrate and electrically connects the first substrate to the second substrate;
a first conductive structure provided on the first surface, extending from the first surface to the third surface to contact a partial area of the third surface, and configured to surround at least a partial area of the first surface; and
a second conductive structure comprising a first portion disposed on at least a portion of the fourth surface and a second portion extending from the first portion toward the first surface, wherein the second portion is coupled to the first conductive structure,
wherein the second portion has a coupling protrusion that protrudes toward the first conductive structure,
wherein the first conductive structure has a coupling groove into which the coupling protrusion is accommodated,
wherein first recess and protrusion structures corresponding to each other are provided in the first surface of the first substrate and one surface of the first conductive structure that are in contact with each other,
wherein second recess and protrusion structures corresponding to each other are provided in the fourth surface of the second substrate and one surface of the second conductive structure that are in contact with each other, and
wherein the first recess and protrusion structures fix the first conductive structure to the first substrate, and the second recess and protrusion structures fix the second conductive structure to the second substrate.

16. The electronic device of claim 15,
wherein the first conductive structure is electrically connected to a first ground area defined in the first substrate, and
wherein the second conductive structure is electrically connected to a second ground area defined in the second substrate.

* * * * *